United States Patent
Baigar et al.

(10) Patent No.: US 10,935,527 B2
(45) Date of Patent: Mar. 2, 2021

(54) USE OF AN ACOUSTIC WAVE IN A CHROMATOGRAPHY SYSTEM

(71) Applicant: DIONEX SOFTRON GMBH, Germering (DE)

(72) Inventors: Erik Baigar, Munich (DE); Christoph Strobl, Munich (DE)

(73) Assignee: DIONEX SOFTRON GMBH, Germering (DE)

( * ) Notice: Subject to any disclaimer, the term of this patent is extended or adjusted under 35 U.S.C. 154(b) by 174 days.

(21) Appl. No.: 16/284,942

(22) Filed: Feb. 25, 2019

(65) Prior Publication Data
US 2019/0271671 A1  Sep. 5, 2019

(30) Foreign Application Priority Data
Mar. 1, 2018 (DE) .......... 10 2018 104 669

(51) Int. Cl.
*G01N 30/76* (2006.01)
*H01L 41/053* (2006.01)
(Continued)

(52) U.S. Cl.
CPC ............. *G01N 30/76* (2013.01); *B01D 15/10* (2013.01); *G01N 30/38* (2013.01); *H01L 41/053* (2013.01);
(Continued)

(58) Field of Classification Search
CPC .. G01N 30/38; G01N 30/76; G01N 2030/027; G01N 2030/765; B01D 15/10; H01L 41/053; H01L 41/09
See application file for complete search history.

(56) References Cited

U.S. PATENT DOCUMENTS

| 4,932,255 A | 6/1990 | Brace et al. |
| 5,003,822 A * | 4/1991 | Joshi .......... G01F 1/66 73/204.15 |

(Continued)

FOREIGN PATENT DOCUMENTS

| DE | 10125124 A1 | 11/2002 |
| DE | 10337692 B3 | 3/2005 |
| WO | 2005/015196 A1 | 2/2005 |

OTHER PUBLICATIONS

Strobl, "Mikro- und Nanofluidik auf piezoeiektrischen Substraten", Dissertation, Muenchen : Ludwig-Maximilians-Universitaet Muenchen, (2005), pp. 1-142. URL:https://edoc.ub.uni-muenchen.de/3727/1/Strobl_Christoph.pdf [downloaded Jul. 2, 2018].

*Primary Examiner* — David J Bolduc
(74) *Attorney, Agent, or Firm* — David A. Schell

(57) ABSTRACT

The present invention relates to a method comprising using an acoustic wave in a chromatography system. The present invention also relates to a corresponding system and a corresponding use. The system may comprise a surface acoustic wave assembly, wherein the surface acoustic wave assembly comprises a sender unit comprising a sender transducer for sending an acoustic wave and a detection unit for detecting the acoustic wave, a substrate configured for propagation of the acoustic wave, wherein the sender transducer is connected to the substrate, wherein the substrate comprises a substrate section for propagation of the wave from the sender transducer, wherein this substrate section comprises a substrate surface, wherein the surface acoustic wave assembly further comprises at least one channel for conducting fluid, wherein this channel is partly defined by the substrate surface.

8 Claims, 7 Drawing Sheets

(51) Int. Cl.
  *H01L 41/09* (2006.01)
  *G01N 30/38* (2006.01)
  *B01D 15/10* (2006.01)
  *G01N 30/02* (2006.01)

(52) U.S. Cl.
  CPC ........ *H01L 41/09* (2013.01); *G01N 2030/027* (2013.01); *G01N 2030/765* (2013.01)

(56) References Cited

U.S. PATENT DOCUMENTS

| | | | | |
|---|---|---|---|---|
| 5,117,146 A * | 5/1992 | Martin | ................ | G01N 29/022 310/312 |
| 5,173,667 A * | 12/1992 | Meitzler | ................ | H03H 9/36 310/313 D |
| 5,221,871 A * | 6/1993 | Fuchs | ................ | G01N 29/022 310/313 R |
| 5,325,704 A * | 7/1994 | Mariani | ................ | G01N 29/022 310/313 B |
| 5,365,770 A * | 11/1994 | Meitzler | ................ | G01H 1/16 250/338.4 |
| 5,476,002 A * | 12/1995 | Bowers | ................ | G01N 29/022 310/313 D |
| 5,795,993 A * | 8/1998 | Pfeifer | ................ | G01N 29/022 73/24.01 |
| 5,918,258 A * | 6/1999 | Bowers | ................ | G01N 29/022 310/313 D |
| 6,027,760 A * | 2/2000 | Gurer | ................ | B05C 11/08 427/8 |
| 6,161,437 A * | 12/2000 | Brennan | ................ | G01N 21/553 422/50 |
| 6,212,938 B1 * | 4/2001 | Staples | ................ | G01N 30/8651 345/440 |
| 6,609,430 B1 * | 8/2003 | Joshi | ................ | G01F 1/662 73/861.25 |
| 7,127,936 B2 * | 10/2006 | Cardelius | ................ | G01N 29/024 73/24.01 |
| 7,373,838 B2 * | 5/2008 | Liu | ................ | G01F 1/6845 73/204.11 |
| 7,399,280 B2 * | 7/2008 | Liu | ................ | A61B 5/0031 310/313 B |
| 7,942,568 B1 * | 5/2011 | Branch | ................ | B01F 13/0059 366/127 |
| 9,128,033 B2 * | 9/2015 | Lee | ................ | G01N 29/2462 |
| 2002/0014106 A1 | 2/2002 | Srinivasan et al. | | |
| 2004/0069717 A1 * | 4/2004 | Laurell | ................ | A61M 1/3479 210/748.05 |
| 2007/0046142 A1 * | 3/2007 | Obara | ................ | H03H 9/14541 310/313 R |
| 2007/0207548 A1 * | 9/2007 | Blankenstein | ... | G01N 33/56966 436/63 |
| 2007/0231851 A1 * | 10/2007 | Toner | ................ | B01L 3/502746 435/29 |
| 2008/0230859 A1 * | 9/2008 | Zaghloul | ................ | H03H 3/08 257/428 |
| 2009/0314058 A1 * | 12/2009 | Cardelius | ................ | G01N 33/497 73/24.01 |
| 2010/0018288 A1 * | 1/2010 | Yamanaka | ................ | G01N 30/76 73/24.02 |
| 2010/0139377 A1 * | 6/2010 | Huang | ................ | G01N 15/1404 73/61.75 |
| 2010/0304501 A1 * | 12/2010 | Lee | ................ | G01N 33/5438 436/518 |
| 2012/0088295 A1 * | 4/2012 | Yasuda | ................ | C12M 47/04 435/288.7 |
| 2012/0160746 A1 * | 6/2012 | Thorslund | ................ | C12M 47/04 209/552 |
| 2013/0027144 A1 * | 1/2013 | Yamanaka | ................ | H03H 9/0585 331/155 |
| 2013/0192958 A1 * | 8/2013 | Ding | ................ | H02N 2/08 198/617 |
| 2014/0008307 A1 * | 1/2014 | Guldiken | ................ | B01L 3/502761 210/748.05 |
| 2014/0033808 A1 * | 2/2014 | Ding | ................ | C12M 47/04 73/61.75 |
| 2015/0143872 A1 * | 5/2015 | Hassan | ................ | G01N 29/022 73/23.4 |
| 2015/0192546 A1 * | 7/2015 | Weitz | ................ | B01L 3/502792 137/13 |
| 2015/0330887 A1 * | 11/2015 | Shin | ................ | B01D 15/34 73/61.55 |
| 2017/0338400 A1 * | 11/2017 | Sun | ................ | G01N 29/036 |
| 2018/0024100 A1 * | 1/2018 | Sun | ................ | G01N 29/2462 73/23.4 |
| 2018/0224354 A1 * | 8/2018 | Sun | ................ | G01N 29/022 |
| 2018/0284068 A1 * | 10/2018 | Katta | ................ | G01N 29/32 |
| 2018/0340915 A1 * | 11/2018 | Sun | ................ | G01N 30/30 |

\* cited by examiner

USE OF AN ACOUSTIC WAVE IN A CHROMATOGRAPHY SYSTEM

CROSS-REFERENCE TO RELATED APPLICATION

This application claims the priority benefit under 35 U.S.C. § 119 to German Patent Application No. DE 10 2018 104 669.3, filed on Mar. 1, 2018, the disclosure of which is incorporated herein by reference.

The invention lies in the field of chromatography, such as liquid (LC) and particularly in the field of analyte detection and flow measurement for High Performance Liquid Chromatography (HPLC). HPLC is a method of separating samples into their constituent parts. The constituent parts can be separated for subsequent use or their portions can be detected and quantified.

In the field of detection, the state of the art for HPLC relies on two main detection groups or classes.

In one class, the sample remains intact and the measurement is carried out with a defined sample volume and flow. In other words, the sample does not undergo any irreversible physical or chemical process. In more simple words, the sample is recovered at the end of the measurement with its same initial characteristics.

Such a class is also known as non-destructive methods and its detection principles are based on the measurement of specific molecular properties, such as: optical properties, for example, absorption, fluorescence, refractive index; or electrical properties, for example, conductivity and polarizability.

On the other hand, in a second class of detection methods, the sample undergoes a series of physical and/or chemical changes such as evaporation or atomization, generally resulting in loss of the original sample.

In other words, once the sample is subjected to measurements, as part of the process, changes to the initial state of the sample are required for the methods to function and therefore, either by a physical or chemical process, the sample undergoes permanent changes on its original characteristics. This class is also known as destructive methods. Other methods used for sample detection are based, for example, on mass-selective properties, such as mass inertia and time-of-flight.

The state of art in the field of flow measurement, is based, inter alia, on determining the flow by specific means such as: mechanical, for example, propeller, Coriolis force, gravimetrically, volumetrically, sample particles, pitot tube and measurements based on a defined flow resistance with differential pressure; thermal, for example, hot-wire measurement and heat transport; and sound velocity, for example, propagation in and counter to the propagation direction of the sound.

In HPLC systems, the correct flow is subsequently ensured by the drive in a mathematical manner. By measuring the pressure and indicating the compressibility of the fluid by means of measurements, input or calculation with approximation methods, the flow of a drive or pump arrangement is calculated and the drive speed is adjusted to the displaced or suctioned-in volume.

One of the challenging aspects in the field of detection, is the detection of analytes. In other words, depending on the applied detection method, not all analytes may be detected. For example, in the case of optical absorption measurement, non-absorbent substances are not visible, and thus can neither be detected nor quantified.

As an example, in the field of absorption measurements, the sensitivity of the method for weakly absorbing substances may be increased by using special techniques, for example, such as light pipe measuring cells. Moreover, for such techniques, the sample volume does not need to be disproportionally enlarged.

Another alternative available according to the prior art is, for example, the combination of multiple complementary measuring methods or, where applicable, also a modification of the sample, for example, derivatization after separation in the column, in order to create measurable characteristics.

However, even though different methods are combined in order to simultaneously measure multiple characteristics and to expand the detectable classes of substances, many substances still remain inaccessible, i.e., it is not possible to detect such substances. For example, in the field of absorption measurements, series connection of an optical detector and mass spectrometer, where the optical inactivity or low optical activity for certain substances may be not totally resolved.

Additionally, the combination of multiple complementary measuring methods is not free of problems; for example, back pressure of mass spectrometers or other atomizing detectors may occur. In other cases, the depletion of the sample also represents a problem. In other words, the sample is used up in one of the applied methods and as result it is not possible to switch to another detector in series.

A further problem with detectors in series is observed due to dispersion. The peaks become broader during passing of the first detector and the supply to the second one. Consequently, the sensitivity, with respect to the substance amount as well as with respect to the separation of substances that elute successively, is reduced. Furthermore, the series connection of detectors is associated with a considerable cost disadvantage.

Another available option is the collection of sample components after separation, so-called fractioning, and subsequent independent examination with other methods, such as, for example, nuclear magnetic resonance. However, this method likewise creates a higher equipment cost and significantly longer analysis time, and the fractioning also requires for the correct switching times to be known.

In the field of flow measurement, the current methods experience occurrence of errors which are not taken into account, for example, due to volume excess during the mixing of two liquids. When two liquid volumes are mixed, for example, water and methanol, results in a smaller total volume, as compared to the individual volumes, due to volume contraction after thermal balancing. Therefore, the calculated flow is not correct, since the HPLC drive calculates only the individual flows, failing to take into account a subsequent mixing of the two individual flows, as is the case in a high pressure gradient (HPG) pump. This results in an error for the total flow of the mixture.

Even though, a volumetric measurement of the flow following the intermixing of individual flows may, for example, represent a possible solution, presently, no actual solution is available.

In light of the above, it is therefore an object of the invention to overcome or at least alleviate the shortcomings and disadvantages of the prior art. More particularly, it is an object of the present invention to provide a non-destructive method to detect analytes and/or to determine a flow in a LC system.

In particular, the present invention relates to analytes detection and flow measurement for chromatography systems, a method performed in such a system and a corresponding use of such system.

These objects are met by the present invention.

In a first embodiment, the present invention relates to a method comprising using an acoustic wave in a chromatography system.

Acoustic waves are a type of longitudinal waves, and their characteristics depend on the nature of the propagation medium. Surface acoustic waves are a type of acoustic waves traveling near the surface of a solid and includes both transversal and longitudinal waves. In the present invention, the surface acoustic waves are used as purely transversal acoustic modes, i.e. shear waves. In simple terms, when an acoustic wave propagates in an elastic and continuous medium, it generates a local variation of the pressure or density, which is transmitted in form of a spherical periodic or quasiperiodic wave. Thus, the variation of pressure, humidity or temperature of the medium displaces its molecules. Each molecule of the medium transmits the vibration to the surrounding, triggering a chain movement, and reflecting its properties in the sound waves. It will be understood that the propagation medium may also be referred to as propagation area. The propagation medium may also be constituted by a sample or a sample in contact with a propagation surface, which may interact with the acoustic waves.

There may be supplied a sample in the chromatography system, which may be a preparative and/or an analytical system. In case of a preparative chromatography, the sample may be purified by the system. In other words, the sample may be separated from a mixture of components, also known as matrix. After isolation, the sample may be supplied to the surface acoustic wave unit to permit an interaction with the acoustic waves. Further, the chromatography system may be used to quantify the sample. In other words, the chromatography system may be used as an analytical chromatography with the aim of establishing the presence of a sample and/or measuring its relative proportion in a mixture. In some instances, the use of a chromatography system may be advantageous, as it requires relative small amount of samples and also permits using samples in different physical states, e.g. liquid, gas.

The chromatography system may be a gas chromatography system or an ion chromatography system.

Therefore, the method may also be applied to a gas chromatography, an ion chromatography and/or a liquid chromatography system.

The method may also be applied to a high performance liquid chromatography system.

The method may further comprise conducting liquid with a pressure up to 100 bar through the liquid chromatography system.

The method may further comprise conducting liquid with a pressure exceeding 100 bar, preferably exceeding 500 bar, further preferably exceeding 1,000 bar through the high performance liquid chromatography system.

The acoustic wave may be a surface acoustic wave. In some instances, the use of surface acoustic waves may be advantageous, as it allows control over the generation of sound waves that may propagate with very defined properties on a solid surface. In other words, the characteristics of a sound acoustic wave may remain relative tunable when propagating on a solid surface, for example, a piezoelectric. Therefore, when the surface acoustic waves interact with a sample, it may transfer sufficient inertial forces, and secondary electrical forces if the material is piezoelectric, which may be detected and used to inferred properties of the sample.

The acoustic wave may be used to measure a flow through the system. That is, in a first embodiment, the present technology may be used to determine the flow of a fluid in a system.

The acoustic wave may be used to determine an acoustic impedance of a sample in the system. Surface acoustic waves may provide enough data relating to the time domain of the acoustic resistance. For instance, a surface acoustic wave may be generated with known characteristics, such as defined amplitudes and frequencies. After interaction of the surface acoustic wave with a sample, these values will be altered. Hence, it is possible to correlate the changes of the angular phase of the wave. Such variation on the phase will also be reflected on changes of the acoustic impedance. In some instances, detecting and measuring changes of the acoustic impedance may be advantageous, as it is possible to correlated characteristics of the samples, such as its resistance, capacitance, admittance, dipole moment and/or acoustic conductance. Furthermore, surface acoustic waves may provide information relating to variation of the acoustic impedance of a reacting sample. In other words, if, for example, the sample reacts with another substance during the analysis, this interaction may be reflected in a phase shifting. Thus, it may be possible to infer further information of the interaction kinetics, and even further, it may be possible to elucidate other aspects, such as the conditions controlling the process, e.g. it may be possible to determine if the changes are diffusion controlled or if the changes follow certain reaction order, such as a first-order reaction. Hence, the acoustic impedance measurement may be correlated to redox processes or other characteristics explained below.

The method may further comprise generating high frequency sound. The method may further permit interaction of the acoustic wave with the sample.

The method may further comprise performing velocity-independent measurements of the acoustic characteristics of the fluid.

In other words, the method comprises performing measurements at sound paths with angles at 90 degrees to further reduce disturbance variables, for example, the reduction of variation of velocity measurement that can be caused, for example, by the occurrence of difference formation from the "with" and "counter" path.

The methods may further comprise measuring of other parameters, such as, for example, conductivity, permittivity, pressure, temperature and/or linear expansion. For instance, the surface acoustic wave may be used to measure conductivity through the system. Transducers may be used to convert electrical energy into mechanical energy and vice versa and this may allow to determine the conductivity of a sample by means of surface acoustic waves. Furthermore, such as conductivity measurements may allow to identify or monitor other types of process, e.g. physical chemical reactions which may involve changes of the system pH, which would be reflected in changes of the system's conductivity. It will be understood that a system may be also be represented by a sample or mixture containing a sample of interested.

Surface acoustic waves may be used to measure (small) length changes of a surface acoustic wave device. However, variations of length of the surface acoustic wave device are due to external changes, e.g. thermal expansion or strain due to pressure. In some instances, the surface acoustic wave may be used to measure a linear expansion of the system. For example, in case of 4 Kelvin experiments, the surface acoustic wave may be emitted with such an intensity that may generate enough mechanical energy to induce changes on the sample's dimension. In the present invention, the sample volume required may be very small, and this may form a very thin layer on the surface of the surface acoustic wave unit, therefore, the thermal changes, due to the energy supplied by the acoustic wave, may be considered to be a one-dimension expansion. In other words, the sample may form a thin layer of such a thickness that the changes of the dimension of the sample may be considered a length variation and not a volumetric expansion. Thus, it is possible to correlate the variation on the sample's dimension on the surface wave acoustic waves as changes related to a linear expansion of the system.

The method may further comprise emitting of surface acoustic waves in propagation directions in which no pure modes but mixed modes may be generated.

The method may further comprise emitting continuous waves.

The method may further comprise emitting pulsed waves.

The method may further comprise emitting amplitude modulated waves.

The method may further comprise emitting waves with a frequency band.

The method may further comprise emitting waves with a fixed frequency.

The method may comprise emitting waves with variable frequencies over time. The method may comprise inputting frequencies with different temporal patterns. In simple words, the surface acoustic waves may be used to study frequency-dependent processes.

The method may further comprise reducing disturbances by alternatingly reversing a direction of the acoustic wave.

The method may further utilize optical methods, such as, for example, absorption, fluorescence and/or Raman spectroscopy. In some instances, the combination of optical methods with surface acoustic waves may be advantageous, as the optical methods may facilitate studying other aspects of the sample. For instance, Raman spectroscopy may permit studying samples that are Raman active. In other words, for example, if a sample is Raman active, i.e., the sample possesses Raman active modes of its molecules, and these modes has a point of symmetry, it would be possible to retrieve data that may further be processed, e.g. by theoretical analysis of molecule motions, and associate them to a symmetry class. In more simple words, combining surface acoustic wave with Raman spectroscopy may facilitate information related to the vibration and/or rotation modes. Furthermore, the possibility of combining the surface acoustic wave with other optical methods, may also be advantageous, since characteristics of a sample that are not observed in a given optical method (e.g. Raman spectroscopy), are typical observable in other optical methods, such as infrared spectroscopy.

The method may comprise performing measurements with a fixed intensity of the acoustic wave.

The method may comprise performing measurements with variable intensities over time. The method may preferably further comprise compensating a time variance by differential measurements.

The method may utilize amplitudes of the acoustic wave for determining a characteristic of the system.

The method may utilize phases of the acoustic wave for determining a characteristic of the system.

The method may utilize run times of the acoustic wave for determining a characteristic of the system, i.e. the may utilize the speed of the sound wave for determining characteristics of the system.

The method may further comprise using an acoustic wave to mix a fluid in the system.

In a further embodiment, the present invention relates to a system for use in chromatography. The system may be configured to carry out the method as explained above.

The system comprises a surface acoustic wave assembly. The surface acoustic wave assembly comprises a sender unit, which may comprise a sender transducer for sending an acoustic wave and a detection unit for detecting the acoustic wave. The surface acoustic wave assembly further comprises substrate configured for propagation of the acoustic wave and the sender transducer is connected to the substrate. The substrate may comprise a substrate section for propagation of the wave from the sender transducer, wherein this substrate section may comprise a substrate surface. The surface acoustic wave assembly further comprises at least one channel for conducting fluid, wherein this channel is partly defined by the substrate surface. Further, the transducer may be allocated on the substrate, and still be covered by a layer of a coating. It will be understood, that the substrate may have a sectional conformation, where portions of the substrate are constituted by a non-piezoelectric material and other sections are constituted by a piezoelectric. For instance, the substrate may be constituted by piezoelectric materials in two ends of the substrate, and a third section allocated in between these two piezoelectric sections may be of a non-piezoelectric material. Therefore, the surface acoustic waves may be generated by means of a piezoelectric and transferred to a non-piezoelectric section where it interacts with the sample, to later continue the propagation of the surface acoustic waves through the piezoelectric section located to the other end of the non-piezoelectric section, thus, allowing the surface acoustic waves to be detected.

It will also be understood that the substrate surface may refer to the surface on which the interaction of acoustic wave and the sample takes places. In simple words, the substrate surface may refer to the sound wave-sample interface. It will also be understood that this interaction interface may refer to the sound wave-liquid interface, and that the liquid may carry a sample of interest. Furthermore, the substrate surface may refer to the interface at which the interaction between the sound waves and a sample of interested takes place. The sample of interest may be contained within a carried medium, and this medium may have different physical states, such as liquid, gas.

In other words, the system may be adapted to assume a configuration, which may allow a sample in a channel to interact with acoustic waves generated from a sender device.

The detection unit may comprise a laser source and a laser detector, and the laser source and the laser detector may be located on different sides of the acoustic wave.

Thus, the acoustic wave may be used as a diffraction grating for the laser and alterations of the acoustic wave give rise to alterations in the detected laser. Thus, the laser may be used as a detection unit for the acoustic wave. In other words, the method may comprise tracing the amplitude measurement by an optical method instead of a receiving transducer. In particular, the strength of the first-order grating may be used as a measure for the amplitude of the surface acoustic wave.

The detection unit may at least be one receiver transducer for receiving the acoustic wave, and the at least one receiver transducer may be connected to the substrate. The substrate section may be between the sender transducer and the at least one receiver transducer.

The surface may be a plan surface.

The system may comprise a surface acoustic wave chip comprising the sender transducer, the detection unit, and the substrate.

The system may further comprise a measuring cell, which may have at least one channel. The at least one channel may be defined by the substrate surface and by the measuring cell.

The system may be adapted to assume a configuration to supply a sample to the measuring cell, and the measuring cell may be adapted to define the trajectory of the sample on the substrate.

The measuring cell may comprise a measuring cell surface and at least one recess in the measuring cell surface. The at least one recess and the substrate surface may define the at least one channel, and the at least one recess may preferably be milled into the measuring cell surface.

The surface acoustic wave assembly may define a longitudinal direction.

The at least one receiver transducer may comprise two receiver transducers.

The at least one channel may be one channel preferably having a width perpendicular to a flow direction and parallel to the substrate surface in the range of 10 μm to 8 mm, preferably 50 μm to 5 mm.

The at least one channel may comprise two channels, each one preferably having the width as defined in the preceding paragraph.

Generally, the dimension of the channel may be chosen depending on the exact application of the present technology. If the wave propagates parallel to the channel, it may generally be desirable to have a relatively wide channel (being substantially equal to a way of the sound wave) so that a substantial section of the wave interacts with the channel (as it will be understood that a part of the wave propagating next to the channel will reduce the usable signal). When flows of the fluid are to be detected, it may be desirable to have a high flow velocity and thus a relatively narrow channel. In applications where the sound wave propagates perpendicular to the flow direction of the fluid, it may also be advantageous to have a relatively wide channel. In some applications, it may also be advantageous that the dimensions of the channel essentially correspond (e.g., are in the same order of magnitude) to a wavelength of the used waves.

The two channels may be parallel to one another.

The at least one channel may be parallel to a propagation direction of the acoustic wave.

The at least one channel may be parallel to a connection vector, which may be defined by a connection between the sender transducer and the at least one receiver transducer.

The at least one channel may be perpendicular to a propagation direction of the acoustic wave.

The at least one channel may be perpendicular to a connection vector, which may be defined by a connection between the sender transducer and the at least one receiver transducer.

The at least one channel may be at an offset angle in the range of 1° to 89°, preferably 10° to 80°, such as 20° to 70° with respect to a propagation direction of the acoustic wave.

The at least one channel at the offset angle to a connection vector may be defined by a connection between the sender transducer and the at least one receiver transducer.

The at least one channel may comprise a U-channel having a general U-shape in the plane of the substrate surface.

The U-shaped channel may comprise two legs perpendicular to a propagation direction of the surface acoustic wave.

This may allow velocity-independent measurements of characteristics of the fluid. This may also further reduce disturbance variables, for example, the reduction of variation of velocity measurement that can be caused, for example, by the occurrence of difference formation from the "with" and "counter" path.

The receiver transducers may be located at different longitudinal positions than the sender transducer.

The receiver transducers may be located at the same longitudinal position.

The longitudinal direction may be the propagation direction of the wave.

The at least one channel may comprise a conductive coating, such as a coating with a conductive polymer or a metallic layer.

In such a way only mechanical characteristics of the wave may be affected, while there may be no electrical effects.

Further, by coating the channel, an interaction of the acoustic wave in the channel may be amplified, e.g. by interaction between sound and sample, such as by a longer residence time of the molecules. In other words, the interaction of the ions of liquid sample may be amplified through an interaction with the coating on the chip surface. Put in other words, the ion or the ions contained in the liquid sample may temporarily bind to the coating deposited on the surface chip. This temporal binding may change the characteristics of the coating and may have an effect on the surface acoustic wave. In more simple words, a coating channel may provide two principal possibilities. On the one hand, the coating may concentrate on the chip surface the energy of the surface acoustic waves on the chip surface, resulting in a higher availability of interaction energy for its detection. On the other hand, the molecules or ions may temporarily bind to the surface acoustic wave chip surface, and thus these molecules may be closer to the surface acoustic waves, and consequently may interact more strongly. This interaction may result in a stationary state that may influence the surface acoustic waves.

The sender transducer may be configured to emit continuous waves.

The sender transducer may be configured to emit pulsed waves.

The sender transducer may be configured to emit waves with a fixed frequency.

The sender transducer may be configured to emit waves with variable frequencies over time. Further, the system may preferably be configured to input frequencies with different temporal patterns.

The sender transducer may be configured to emit waves in a frequency band.

The sender transducer may be configured to simultaneously emit waves at different frequencies.

The sender transducer may be configured to emit waves at a fixed intensity.

The sender transducer may be configured to emit waves with intensities varying over time.

The measuring cell may comprise a plurality of orifices for connecting the at least one channel to other devices.

The surface acoustic wave assembly may further comprise a wave reflector. The reflector and the detection unit may be located on opposite sides of the sender transducer.

The surface acoustic wave assembly may further comprise an additional sender transducer for sending an additional acoustic wave and an additional detection unit for detecting the additional acoustic wave, which may be connected to the substrate.

The additional sender transducer and the additional detection unit may have the features of the sender transducer and the detection unit of any of the system embodiments discussed above.

The longitudinal position of the sender transducer may correspond to a longitudinal position of the additional detection unit, and the longitudinal position of the additional sender transducer may correspond to a longitudinal position of the detection unit.

Such an embodiment may allow the direction of acoustic waves to be switched to compensate for errors.

The sender unit may comprise a second sender transducer.

The sender transducer and the second sender transducer may be fused together to thereby form the sender unit.

In other words, the sender unit may be designed in such a way that it consists of two parts that may allow the device to be switched electrically.

The sender transducer and the second sender transducer are preferably located on different longitudinal positions, and the system may be configured to utilize a beat generated by signals of the sender transducer and the second sender transducer.

In more simple words, additional transducers functioning as additional sender and receivers may be placed on each side of the surface acoustic wave chip, which may allow to reverse and alternate the direction of the waves.

The substrate may be formed of a transparent material, such as lithium tantalate.

The system may further be adapted to couple additional optical measurement.

The sender unit and the detection unit may be located on the substrate surface.

The sender unit and the detection unit may be located on a side opposite to the substrate surface.

The substrate surface may comprise a coating configured to react to a shear flow. In some instances, it may be advantageous, as it may allow to correlate surface acoustic waves with microfluidic studies of proteins, such as glycoproteins, and further correlate data of surface acoustic waves with, for example, the von Willebrand factor, to study processes such as elongation of proteins or tension-dependent activation in protein binding processes.

The substrate may be metallic.

The substrate may be a metalloid.

The substrate may be a semiconductor, e.g., silicon.

The substrate may be piezoelectric.

The substrate may have an area in the range of 0.0001 mm$^2$ to 50 cm$^2$, preferably 0.05 mm$^2$ to 10 cm$^2$.

The sender unit may be distanced from the detection unit by a distance in the range of 10 μm to 10 cm, preferably 50 μm to 2 cm The measuring cell may be disconnectable from the substrate.

The at least one channel may comprise a cross section in the range of 0.0005 mm$^2$ to 20 mm$^2$, preferably 0.0025 mm$^2$ to 5 mm$^2$.

The U-channel may be located such that two legs of the U-channel may be parallel to a propagation direction of the acoustic wave.

The channel may have a height perpendicular to the substrate surface not exceeding 0.4 mm, preferably not exceeding 0.1 mm, such as not exceeding 0.05 mm.

Such dimensions may correspond to the depth of the extension of the electric field into a fluid present in the channel. Thus, this may allow for a sufficient interaction between the wave and the fluid, while at the same time resulting in a relatively small cross channel, which may be advantageous, e.g., if a flow is determined (as the speed in the channel at a given flow is higher, the lower the cross section of the channel).

The system may further comprise a conduit connecting the two channels.

The detection unit may comprise a detection transducer.

The system may further comprise a coating covering at least a portion of the substrate and at least a portion of the sender transducer.

The coating may also cover at least a portion of the detection unit.

The substrate may further comprise a first piezoelectric section, and a second piezoelectric section, and the substrate section for propagation of the wave may be non-piezoelectric, and the sender unit may be connected to the first piezoelectric section, and the detection unit may be connected to the second piezoelectric section.

The method may utilize the system according to any of the preceding system embodiments.

The method may comprise conducting a fluid, preferably comprising a sample to be analyzed, through the channel.

The method may comprise conducting a fluid parallel to the propagation direction and co-directional to the propagation direction through the at least one channel.

The method may comprise conducting a fluid through the at least one channel in a direction opposite to the propagation direction of the wave.

Therein the method may comprise conducting a fluid through the at least one channel in a direction perpendicular to the propagation direction of the wave.

The method may also comprise conducting a fluid through a first channel in a first flow direction; and conducting a fluid through a second channel in a second flow direction opposite to the first flow direction.

In particular, this may be combined with a wave propagating perpendicular to these flow directions. This may allow velocity-independent measurements of characteristics of the fluid. This may also further reduce disturbance variables, for example, the reduction of variation of velocity measurement that can be caused, for example, by the occurrence of difference formation from the "with" and "counter" path.

The method may further comprise using an adjustment cell for alignment of the measuring cell.

The method may comprise operating the transducers on harmonics, and the transducers may operate together with a basic mode.

The method may comprise conducting a flow through the channel in the range of of 1 nl/min to 200 ml/min, preferably 10 nl/min to 100 ml/min, further preferably 0.05 ml/min to 10 ml/min.

A solvent with a sample may be conducted through a first channel, and the solvent without the sample may be conducted through a second channel. The solvent without the sample may be used as a reference for a differential measurement.

The method may comprise conducting a solvent through a first channel of the two channels, through the conduit and through a second channel of the two channels, and supplying a sample to the solvent. The solvent with the sample may be conducted through the first channel, the solvent without the sample may be conducted through the second channel, and the method may further comprise using the solvent without the sample as a reference for a differential measurement.

The method may comprise conducting a solvent through a first channel of the two channels, through the conduit and through a second channel of the two channels, and supplying a sample with a time-varying gradient to the solvent. The solvent with the sample at a first concentration may be conducted through the first channel, the solvent with the sample at a second concentration may be conducted through the second channel, and the method may further comprise using the solvent with the sample at the second concentration as a reference for a differential measurement.

The use may be for chromatography.

The use may be for liquid chromatography.

The use may be for high performance liquid chromatography.

In other words, embodiments of the present invention relate to the use of a surface acoustic wave chip unit in a HPLC system. It covers the use of a surface acoustic wave chip unit in a HPLC system for measuring the flow taken along the sound waves, and namely by means of a with/counter-arrangements using phase measurement, or by means of a 90° arrangement by using amplitude comparison.

A new detection method, which in addition to the previous method such as, for example, absorption, fluorescence, refractive index, mass, and conductivity, makes available an additional mechanism for quantitative measurement. Apart from the possibility of an obtained through-flow measurement for application in contemporary ultrahigh liquid chromatography, the sample volume required for the detection should be as small as possible.

The use of sound waves for examining the flowing medium opens up a new property to be examined, namely the acoustic impedance. This property may yield an additional, complementary degree of freedom to the existing methods. For example, viscosity, permittivity, and/or polarizability of the flowing medium as well as their variations due to the contained analytes may be detected and quantified based on a varying interaction with a sound wave.

Surface waves may be used in analytics, e.g. for binding a specific type of molecule through a functionalized surface and for detecting it, e.g. through the change in the resonance frequency of a thin membrane that is induced by the additional mass deposition. However, in the present application of the technology, it is an aim to forego functionalization. In this regard, it is noted that functionalization is specific, which is not required for the present technology due to the upstream separation; instead, it is intended in the present technology to measure in a manner that is as unspecific as possible. Moreover, the functionalized surface has to be cleaned after each cycle, which is time-consuming and not 100% possible, whereby the possible number of cycles is strongly limited or a quantitative measurement is complicated. However, this objective has the disadvantage that relatively small effects have to be expected, while at the same time a high detection sensitivity is desired.

The surface acoustic wave chip may be used to measure the actual flow of the mixture in a smaller volume. At that, the composition of the mixture may not change, and the measuring chip may provide feedback to the drives about the measured total volume flow, so that the drives can readjust in a suitable manner to compensate for the flow error resulting from the mixing. At that, the contact of the surface acoustic wave chip with respect to the active surface can be direct or indirect.

In both application cases, in particular the measuring cell, which is a consumable material, may be relatively simple and chemically compatible with all solvents commonly used in HPLC. While a high compressive strength, for example above 100 bars, is not necessary in the field of detection, such compressive strengths are desirable in the field of flow measurement. Furthermore, by measuring the acoustic characteristics at the surface of the surface acoustic wave chip, the required sample volume is very small.

The manufacture of surface acoustic wave chips can be carried out on a larger scale in a relatively efficient manner. In addition, the measurement can be carried out in a contact-free manner, the sound generation and detection do not have to take place in the liquid, which renders an easier manufacture of the transducers. Moreover, the portion of the surface acoustic wave chip that is in direct contact with the liquid can be manufactured with carrier materials, such as, for example, lithium tantalate, that tolerate the commonly used solvents well. In addition, the protection by means of a very inert layer, such as for example SiO2, can be easily realized on cost-effective manner, and such a layer also allows for the metrological characteristics of the arrangement to be adjusted.

The present technology is also defined by the following numbered embodiments.

Below, method embodiments will be discussed. These embodiments are abbreviated by the letter "M" followed by a number. When reference is herein made to a method embodiment, those embodiments are meant.

M1. A method comprising using an acoustic wave in a chromatography system.

M2. The method according to the preceding embodiment, wherein the chromatography system is a gas chromatography system.

M3. The method according embodiment M1, wherein the chromatography system is an ion chromatography system.

M4. The method according to embodiment M1, wherein the chromatography system is a liquid chromatography system.

M5. The method according to the preceding embodiment, wherein the method further comprises conducting liquid with a pressure up to 100 bar through the liquid chromatography system.

M6. The method according to the preceding embodiment, wherein the liquid chromatography system is a high performance liquid chromatography system.

M7. The method according to the preceding embodiment, wherein the method further comprises conducting liquid with a pressure exceeding 100 bar, preferably exceeding 500 bar, further preferably exceeding 1,000 bar through the high performance liquid chromatography system.

M8. The method according to any of the preceding embodiment, wherein the acoustic wave is a surface acoustic wave.

M9. The method according to any of the preceding embodiments, wherein the acoustic wave is used to measure a flow through the system.

M10. The method according to any of the preceding embodiments, wherein the acoustic wave is used to determine an acoustic impedance of a sample in the system.

M11. The method in accordance with any of the preceding embodiments, wherein the method further comprises generating high frequency sound, wherein the method further comprises permitting interaction of the acoustic wave with a sample.

M12. The method in accordance with any of the preceding embodiments, wherein the methods further comprises measuring other parameters, such as, for example, conductivity, permittivity, pressure, temperature and/or linear expansion.

M13. The method in accordance with any of the preceding embodiments, wherein the method further comprises emitting of surface acoustic waves in propagation directions in which no pure modes but mixed modes are generated.

M14. The method in accordance with any of the preceding embodiments, wherein the method further comprises emitting continuous waves.

M15. The method in accordance with any of the preceding embodiments, wherein the method further comprises emitting pulsed waves.

M16. The method in accordance with any of the preceding embodiments, wherein the method further comprises emitting amplitude modulated waves.

M17. The method in accordance with any of the preceding embodiments, wherein the method further comprises emitting waves with a frequency band.

M18. The method in accordance with any of the preceding embodiments, wherein the method further comprises emitting waves with a fixed frequency.

M19. The method in accordance with any of the preceding embodiments, wherein the method comprises emitting waves with variable frequencies over time, wherein the method further comprises inputting frequencies with different temporal patterns.

M20. The method in accordance with any of the preceding embodiments, wherein the method further comprises reducing disturbances by alternatingly reversing a direction of the acoustic wave.

M21. The method in accordance with any of the preceding embodiments, wherein the method further utilizes optical methods, such as, for example, absorption, fluorescence and/or Raman spectroscopy.

M22. The method in accordance with any of the preceding embodiments, wherein the method comprises performing measurements with a fixed intensity of the acoustic wave.

M23. The method in accordance with any of the preceding embodiments, wherein the method comprises performing measurements with variable intensities over time, wherein the method preferably further comprises compensating a time variance by differential measurements.

M24. The method in accordance with any of the preceding embodiments, wherein the method utilizes amplitudes of the acoustic wave for determining a characteristic of the system.

M25. The method in accordance with any of the preceding embodiments, wherein the method utilizes phases of the acoustic wave for determining a characteristic of the system.

M26. The method in accordance with any of the preceding embodiments, wherein the method utilizes run times of the acoustic wave for determining a characteristic of the system.

M27. The method in accordance with any of the preceding embodiments, wherein the method further comprises using an acoustic wave to mix a fluid in the system.

Below, system embodiments will be discussed. These embodiments are abbreviated by the letter "S" followed by a number. When reference is herein made to a system embodiment, those embodiments are meant.

S1. A system configured to carry out the method according to any of the preceding method embodiments.

S2. The system according to the preceding embodiment, wherein the system comprises a surface acoustic wave assembly, wherein the surface acoustic wave assembly comprises
    a sender unit comprising a sender transducer for sending an acoustic wave and a detection unit for detecting the acoustic wave,
    a substrate configured for propagation of the acoustic wave,
    wherein the sender transducer is connected to the substrate,
    wherein the substrate comprises a substrate section for propagation of the wave from the sender transducer, wherein this substrate section comprises a substrate surface,
    wherein the surface acoustic wave assembly further comprises at least one channel for conducting fluid, wherein this channel is partly defined by the substrate surface.

In other words, the system is adapted to assume a configuration allowing a sample in a channel to interact with acoustic waves generated from a sender device.

S3. The system according to the preceding embodiment, wherein the detection unit comprises a laser source and a laser detector, wherein the laser source and the laser detector are located on different sides of the acoustic wave.

Thus, the acoustic wave may be used as a diffraction grating for the laser and alterations of the acoustic wave give rise to alterations in the detected laser. Thus, the laser may be used as a detection unit for the acoustic wave. In other words, the method comprises tracing the amplitude measurement by an optical method instead of a receiving transducer. In particular, the strength of the first-order grating may be used as a measure for the amplitude of the surface acoustic wave.

S4. The system according to the penultimate embodiment, wherein
    the detection unit is at least one receiver transducer for receiving the acoustic wave,
    the at least one receiver transducer is connected to the substrate, and
    the substrate section is between the sender transducer and the at least one receiver transducer.

S5. The system according to any of the preceding 3 embodiments, wherein the surface is a plan surface.

S6. The system according to any of the preceding system embodiments and with the features of embodiment S2, wherein the system comprises a surface acoustic wave chip comprising the sender transducer, the detection unit, and the substrate.

S7. The system according to any of the system preceding embodiments with the features of embodiment S2, wherein the system further comprises a measuring cell, and wherein the at least one channel is defined by the substrate surface and by the measuring cell.

The system may be adapted to assume a configuration to supply a sample to the measuring cell, wherein the measuring cell is adapted to define the trajectory of the sample on the substrate.

S8. The system according to the preceding embodiment, wherein the measuring cell comprises a measuring cell surface and at least one recess in the measuring cell surface, wherein the at least one recess and the substrate surface define the at least one channel, wherein the at least one recess is preferably milled into the measuring cell surface.

S9. The system according to any of the preceding system embodiments, wherein the surface acoustic wave assembly defines a longitudinal direction.

S10. The system in accordance with any of the preceding system embodiments with the features of embodiment S4, wherein the at least one receiver transducer comprises two receiver transducers.

S11. The system according to any of the preceding system embodiments with the features of embodiment S2, wherein the at least one channel is one channel preferably having a width perpendicular to a flow direction and parallel to the substrate surface in the range of 10 µm to 8 mm, preferably 50 µm to 5 mm.

S12. The system according to any of the embodiments S1 to S10 with the features of embodiment S2, wherein the at least one channel comprises two channels, each one preferably having the width of the preceding embodiment.

S13. The system according to the preceding embodiment, wherein the two channels are parallel to one another.

S14. The system according to any of the preceding system embodiments with the features of embodiment S2, wherein the at least one channel is parallel to a propagation direction of the acoustic wave.

S15. The system according to the preceding embodiment and with the features of embodiment S4, wherein the at least one channel is parallel to a connection vector defined by a connection between the sender transducer and the at least one receiver transducer.

S16. The system according to any of the embodiments S1 to S13 with the features of embodiment S2, wherein the at least one channel is perpendicular to a propagation direction of the acoustic wave.

S17. The system according to the preceding embodiment and with the features of embodiment S4, wherein the at least one channel is perpendicular to a connection vector defined by a connection between the sender transducer and the at least one receiver transducer.

S18. The system according to any of the embodiments S1 to S13 with the features of embodiment S2, wherein the at least one channel is at an offset angle in the range of 1° to 89°, preferably 10° to 80°, such as 20° to 70° with respect to a propagation direction of the acoustic wave.

S19. The system according to the preceding embodiment and with the features of embodiment S4, wherein the at least one channel is at the offset angle to a connection vector defined by a connection between the sender transducer and the at least one receiver transducer.

S20. The system according to any of the preceding system embodiments and with the features of embodiment S2, wherein the at least one channel comprises a U-channel having a general U-shape in the plane of the substrate surface.

S21. The system according to the preceding embodiment, wherein the U-shaped channel comprises two legs perpendicular to a propagation direction of the surface acoustic wave.

This may allow velocity-independent measurements of characteristics of the fluid. This may also further reduce disturbance variables, for example, the reduction of variation of velocity measurement that can be caused, for example, by the occurrence of difference formation from the "with" and "counter" path.

S22. The system according to any of the preceding system embodiments with the features of embodiment S9 and S10, wherein the receiver transducers are located at different longitudinal positions than the sender transducer.

S23. The system according to the preceding embodiment, wherein the receiver transducers are located at the same longitudinal position.

S24. The system according to any of the preceding system embodiments with the features of embodiment S9, wherein the longitudinal direction is the propagation direction of the wave.

S25. The system according to any of the preceding system embodiments with the features of embodiment S2, wherein the at least one channel comprises a conductive coating, such as a coating with a conductive polymer or a metallic layer.

In such a way only mechanical characteristics of the wave may be affected, while there may be no electrical effects.

S26. The system according to any of the preceding system embodiments, wherein the sender transducer is configured to emit continuous waves.

S27. The system according to any of the preceding system embodiments, wherein the sender transducer is configured to emit pulsed waves.

S28. The system according to any of the preceding system embodiments, wherein the sender transducer is configured to emit waves with a fixed frequency.

S29. The system according to any of the preceding system embodiments, wherein the sender transducer is configured to emit waves with variable frequencies over time, wherein the system preferably is further configured to input frequencies with different temporal patterns.

S30. The system according to any of the preceding system embodiments, wherein the sender transducer is configured to emit waves in a frequency band.

S31. The system according to any of the preceding system embodiments, wherein the sender transducer is configured to simultaneously emit waves at different frequencies.

S32. The system according to any of the preceding system embodiments, wherein the sender transducer is configured to emit waves at a fixed intensity.

S33. The system according to any of the preceding system embodiments, wherein the sender transducer is configured to emit waves with intensities varying over time.

S34. The system according to any of the preceding system embodiments and with the features of embodiment S7, wherein the measuring cell comprises a plurality of orifices for connecting the at least one channel to other devices.

S35. The system according to any of the preceding system embodiments and with the features of embodiment S2, wherein the surface acoustic wave assembly further comprises a wave reflector, wherein the reflector and the detection unit are located on opposite sides of the sender transducer.

S36. The system according to any of the preceding system embodiments and with the features of embodiment S2, wherein the surface acoustic wave assembly further comprises an additional sender transducer for sending an additional acoustic wave and an additional detection unit for detecting the additional acoustic wave, wherein the additional sender transducer is connected to the substrate.

S37. The system according to the preceding embodiment, wherein the additional sender transducer and the additional detection unit have the features of the sender transducer and the detection unit of any of the system embodiments discussed above.

S38. The system according to any of the 2 preceding embodiments and with the features of embodiments S9, wherein a longitudinal position of the sender transducer corresponds to a longitudinal position of the additional detection unit, and a longitudinal position of the additional sender transducer corresponds to a longitudinal position of the detection unit.

Such an embodiment allows the direction of acoustic waves to be switched to compensate for errors.

S39. The system according to any of the preceding system embodiments with the features of embodiment S2, wherein the sender unit comprises a second sender transducer.

In other words, the sender unit may be designed in such a way that it consists of two parts that allow the device to be switched electrically.

In more simple words, additional transducers functioning as additional sender and receivers may be placed on each side of the surface acoustic wave chip, which allows to reverse and alternate the direction of the waves.

S40. The system according to the preceding embodiment, wherein the sender transducer and the second sender transducer are fused together to thereby form the sender unit.

S41. The system according to the preceding embodiment and with the features of embodiment S9, wherein the sender transducer and the second sender transducer are preferably located on different longitudinal positions, and wherein the system is configured to utilize a beat generated by signals of the sender transducer and the second sender transducer.

S42. The system according to any of the preceding system embodiments with the features of embodiment S2, wherein the substrate is formed of a transparent material, such as lithium tantalate.

S43. The system in accordance with the preceding embodiment, wherein the system is further adapted to couple additional optical measurement.

S44. The system according to any of the preceding system embodiments with the features of embodiment S2, wherein the sender unit and the detection unit are located on the substrate surface.

S45. The system according to any of the embodiments S1 to S43, wherein the sender unit and the detection unit are located on a side opposite to the substrate surface.

S46. The system according to any of the preceding system embodiments with the features of embodiment S2, wherein the substrate surface comprises a coating configured to react to a shear flow.

S47. The system according to any of the preceding system embodiments and with the features of embodiment S2, wherein the substrate is metallic.

S48. The system according to any of the preceding system embodiments and with the features of embodiment S2, wherein the substrate is a metalloid.

S49. The system according to any of the preceding system embodiments and with the features of embodiment S2, wherein the substrate is a semiconductor, e.g., silicon.

S50. The system according to any of the preceding system embodiments and with the features of embodiment S2, wherein the substrate is piezoelectric.

S51. The system according to any of the preceding system embodiments and with the features of embodiment S2, wherein the substrate has an area in the range of 0.0001 mm$^2$ to 50 cm$^2$, preferably 0.05 mm$^2$ to 10 cm$^2$.

Interaction surfaces may be in the range of 0.01 mm$^2$ (for nano flow applications) to several cm$^2$. Thus, above substrate sizes may be utilized.

S52. The system according to any of the preceding system embodiments and with the features of embodiments S2, wherein the sender unit is distanced from the detection unit by a distance in the range of 10 μm to 10 cm, preferably 50 μm to 2 cm.

S53. The system according to any of the preceding system embodiments and with the features of embodiment S7, wherein the measuring cell is disconnectable from the substrate.

S54. The system according to any of the preceding system embodiments and with the features of embodiment S2, wherein the at least one channel comprises a cross section in the range of 0.0005 mm$^2$ to 20 mm$^2$, preferably 0.0025 mm$^2$ to 5 mm$^2$.

S55. The system according to any of the preceding system embodiments and with the features of embodiment S20, wherein the U-channel is located such that two legs of the U-channel are parallel to a propagation direction of the acoustic wave.

S56. The system according to any of the preceding system embodiments and with the features of embodiment S2, wherein the channel has a height perpendicular to the substrate surface not exceeding 0.4 mm, preferably not exceeding 0.1 mm, such as not exceeding 0.05 mm.

S57. The system according to any of the preceding system embodiments and with the features of embodiment S12, wherein the system further comprises a conduit connecting the two channels.

S58. The system according to any of the preceding system embodiments with the features of embodiment S2, wherein the detection unit comprises a detection transducer.

S59. The system according to any of the preceding system embodiments with the features of embodiment S2, wherein the system further comprises a coating covering at least a portion of the substrate and at least a portion of the sender transducer.

S60. The system according to the preceding embodiment with the features of embodiment S2, wherein the coating also convers at least a portion of the detection unit.

S61. The system according to any of the preceding embodiments with the features of embodiment S2, wherein the substrate further comprises a first piezoelectric section, and a second piezoelectric section, and wherein the substrate section for propagation of the wave is non-piezoelectric, and wherein the sender unit is connected to the first piezoelectric section, and the detection unit is connected to the second piezoelectric section.

M28. The method according to any of the preceding method embodiments, wherein the method utilizes the system according to any of the preceding system embodiments.

M29. The method according to the preceding embodiment, wherein the system comprises the features of embodiment S2, wherein the method comprises conducting a fluid to be analyzed through the channel, wherein the fluid preferably comprises a sample.

M30. The method according any of the 2 preceding embodiment, wherein the system comprises the features of embodiment S13, wherein the method comprises
  conducting a fluid parallel to the propagation direction and co-directional to the propagation direction through the at least one channel.

M31. The method according to any of the 3 preceding embodiments, wherein the method comprises
  conducting a fluid through the at least one channel in a direction opposite to the propagation direction of the wave.

M32. The method according to any of the 4 preceding embodiments, wherein the method comprises
  conducting a fluid through the at least one channel in a direction perpendicular to the propagation direction of the wave.

M33. The method according to any of the preceding method embodiments, wherein the system comprises the features of embodiment S13, wherein the method comprises
  conducting a fluid through a first channel in a first flow direction;
  conducting a fluid through a second channel in a second flow direction opposite to the first flow direction.

In particular, this may be combined with a wave propagating perpendicular to these flow directions. This may allow velocity-independent measurements of characteristics of the fluid. This may also further reduce disturbance variables, for example, the reduction of variation of velocity measurement that can be caused, for example, by the occurrence of difference formation from the "with" and "counter" path.

M34. The method in accordance with any of the 6 preceding embodiments, wherein the system comprises the features of embodiment S7, wherein the method further comprises using an adjustment cell for alignment of the measuring cell.

M35. The method according to any of the 7 preceding embodiments, wherein the system comprises the features of embodiment S4, wherein the method comprises operating the transducers on harmonics, wherein the method further comprises the transducers operating together with a basic mode.

M36. The method according to any of the 8 preceding embodiments, wherein the system comprises the features of embodiment S2, wherein the method comprises conducting a flow through the channel in the range of 1 nl/min to 200 ml/min, preferably 10 nl/min to 100 ml/min, further preferably 0.05 ml/min to 10 ml/min.

M37. The method according to any of the 9 preceding embodiments, wherein the system comprises the features of embodiment S12, wherein
a solvent with a sample is conducted through a first channel, and
the solvent without the sample is conducted through a second channel,
wherein the solvent without the sample is used as a reference for a differential measurement.

M38. The method according to any of embodiments M28 to M36, wherein the system comprises the features of embodiment S57, wherein the method comprises
conducting a solvent through a first channel of the two channels, through the conduit and through a second channel of the two channels, and
supplying a sample to the solvent,
wherein when the solvent with the sample is conducted through the first channel, the solvent without the sample is conducted through the second channel, and
wherein the method further comprises using the solvent without the sample as a reference for a differential measurement.

M39. The method according to any of embodiments M28 to M36, wherein the system comprises the features of embodiment S57, wherein the method comprises
conducting a solvent through a first channel of the two channels, through the conduit and through a second channel of the two channels, and
supplying a sample with a time-varying gradient to the solvent,
wherein when the solvent with the sample at a first concentration is conducted through the first channel, the solvent with the sample at a second concentration is conducted through the second channel, and
wherein the method further comprises using the solvent with the sample at the second concentration as a reference for a differential measurement.

Below, use embodiments will be discussed. These embodiments are abbreviated by the letter "U" followed by a number. When reference is herein made to a use embodiment, those embodiments are meant.

U1. Use of the method according to any of the preceding method embodiments or the system according to any of the preceding system embodiments in chromatography.

U2. Use of the method according to any of the preceding method embodiments or the system according to any of the preceding system embodiments in liquid chromatography.

U3. Use of the method according to any of the preceding method embodiments or the system according to any of the preceding system embodiments in high performance liquid chromatography.

The present invention will now be described with reference to the accompanying drawings, which illustrate embodiments of the invention. These embodiments should only exemplify, but not limit, the present invention.

It is noted that not all the drawings carry all the reference signs. Instead, in some of the drawings, some of the reference signs have been omitted for sake of the brevity and simplicity of illustration.

Embodiments of the present invention will now be described with reference to the accompanying drawings. Generally, embodiments of the present invention utilize an acoustic wave in chromatography systems to detect an analyte and/or to measure a flow.

Figure 1:
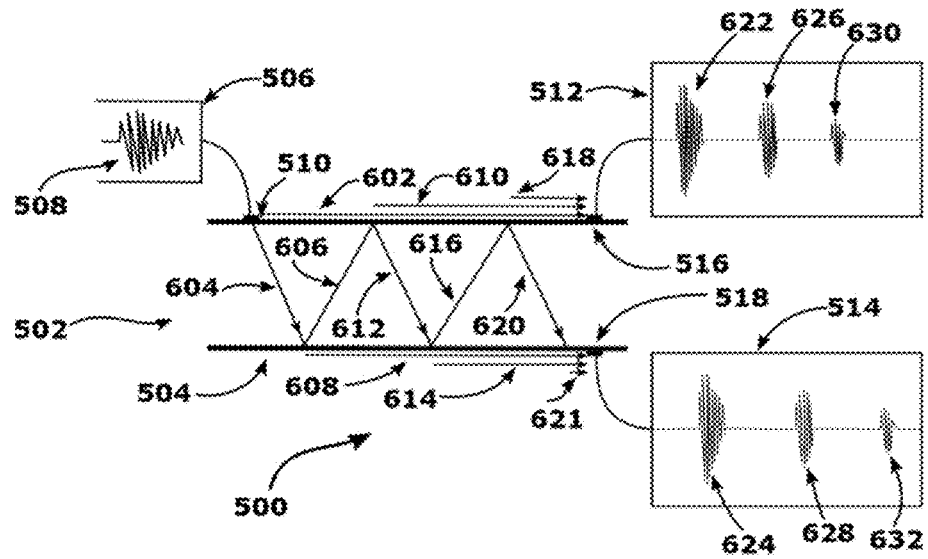
FIG. 1 depicts a system illustrating principles of embodiments of the present invention.

FIG. 1 depicts a system 500 illustrating principles of embodiments of the present invention. In simple terms, the system 500 comprises a tube 502 for conducting a liquid. The tube 502 is defined by a wall 504, which may be, e.g., a circular wall 504. The system 500 also comprises an acoustic wave generator 506, which may also be referred to as an acoustic wave sender 506, or simply sender 506. The sender 506 is configured for generating an acoustic wave, which is conceptually identified by reference numeral 508. The sender 506 is connected to the tube 502 to feed the wave into the tube 502 at a sender connection position 510.

Further, the system 500 also comprises two receivers 512 and 514 for receiving acoustic waves, and more particularly a first receiver 512 and a second receiver 514. The receivers 512, 514 are connected to the tube 502 at a first receiver connection position 516 and at a second receiver connection position 518, respectively.

It will be understood that positions on the circular wall 504 of the tube 502 may be defined by a longitudinal position and by a circumferential or radial position. In the embodiment depicted in FIG. 1, the first receiver connection position 516 and the second receiver connection position 518 have the same longitudinal position, which is different from the longitudinal position of the sender connection position 510.

Further, the radial position of the first receiver connection position 516 is different from the radial position of the second receiver connection position 518. More particularly, in the depicted embodiment, the radial position of the first receiver connection position 516 corresponds to the radial position of the sender connection position 510, while the radial position of the second receiver connection position 518 is opposite to the other two, i.e., the difference between them is 180°.

When now feeding in an acoustic wave by means of the sender 506 and via the sender connection position 510, a first part 602 of the wave will be reflected at the interface between the wall 504 of the tube 502 and the liquid in the tube 502. This first part 602 will travel directly via the wall 504 to the first receiver 512, and it will generate a first signal 622 in the first receiver 512.

A second part 604 of the wave will not be reflected, but will in fact penetrate the liquid in the tube 502 and will travel through the tube 502. After travelling through the tube 502, it will arrive again at the wall 504 of the tube 502. Here, a third part 606 will be reflected at the interface of the liquid in the tube 502 and the wall 504, while a fourth part 608 will be transmitted into the wall 504 of the tube 502 and will then travel directly to the second receiver 514 to here give rise to a second signal 624.

The above described rationale also applies to parts 610, 612, 614, 616, 618, 620, and 621 of the wave, and the corresponding signals 626, 628, 630, 632, respectively.

As can be seen, there is a time delay between the different signals 622 to 632 received by the receivers 512, 514.

The time difference is (at least partly) based on the fact that the surface acoustic wave has different propagation velocities in the wall 504 of the tube 502 and in the liquid present in the tube 502. Furthermore, it will be understood that the propagation velocity of the wave in the liquid in the tube 502 will also depend on the type of the liquid and a flow velocity in the tube 502.

Based on this rationale, an acoustic wave may be used in liquid chromatography to detect and analyze samples within an eluent and/or to measure a flow in a tube.

In further embodiments of the present technology, the receivers may be positioned on the same "side" as the sender, i.e., the wave does not have to travel "through" the liquid. Instead, the interaction occurs only on one surface between a substrate and the liquid. Such embodiments will be described below.

Figure 2:
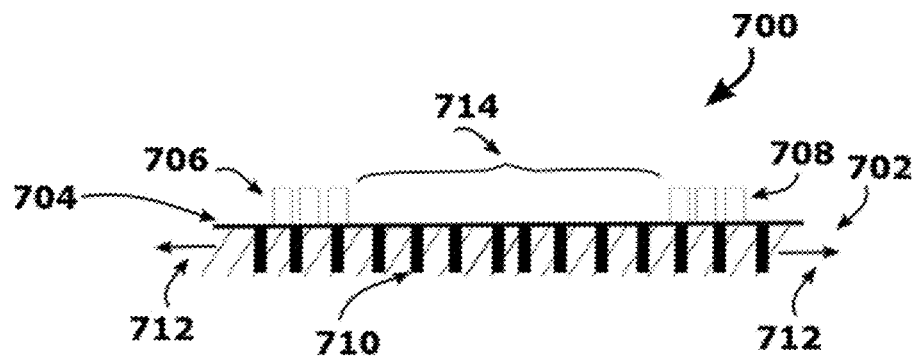
FIG. 2 depicts a schematic cross-section of a surface acoustic wave unit used in liquid chromatography according to embodiments of the present invention in a cross sectional view.
Figure 3:
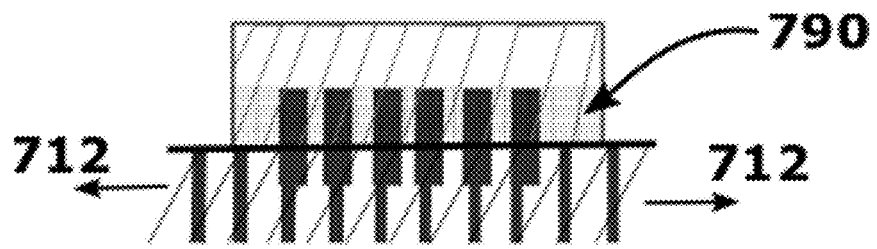
FIG. 3 depicts a schematic cross-section of the interaction volume on a surface acoustic wave unit.

FIG. 2 illustrates a concept of a surface acoustic wave unit 700 used in liquid chromatography according to embodiments of the present invention in a cross sectional view.

The unit 700 comprises a substrate 702 for the propagation of an acoustic wave. The substrate 702 comprises a surface 704, which may also be referred to as a top surface 704, as well as transducers 706, 708 located on the surface 704. The transducer 706 is used to generate a sound wave and may thus also be referred to as the sender transducer 706 (or simply, the sender 706), and the transducer 708 receives the wave, and may thus be referred to as a receiver transducer 708 (or simply: receiver 708). The sender 706 may generate an acoustic wave having wave fronts identified by bars 710. The wave may propagate to the left and to the right, as depicted by arrows 712 in FIG. 2. Once the wave arrives at the receiver 708, it may be detected by receiver 708.

The portion 714 of the surface 704 between the sender 706 and the receiver 708 defines an interaction portion 714. If a liquid (e.g., a sample) is located at this interaction portion 714, it will change the propagation of the wave.

It will be understood that the interaction between the wave (mainly propagating in the substrate 702) and a liquid located at the interaction portion 714 will be mainly at the surface 704 and close thereto. Thus, only a small volume of liquid is necessary for such a configuration, as illustrated in FIG. 23 and identified by reference numeral 790 (which may be advantageous for liquid chromatography and particularly for high performance liquid chromatography). This may also lead to high flow velocities (which may also be advantageous). Furthermore, the deflection is relatively small. In other words, the effect of being taking along by the sound waves is relatively small, since the main portion of the detected sound energy is not propagated in the liquid.

That is, using the above described concept of surface acoustic waves in chromatography, such as HPLC may be advantageous, as it only requires a small volume of liquid for the measurement. However, on the other side, it will be understood that such surface acoustic waves only give rise to relatively small signals, and may thus be subject to external influences. To account for such influences, it may be advantageous to perform a differential measurement. Concepts for such differential measurement will now be described in greater detail.

Figure 4:
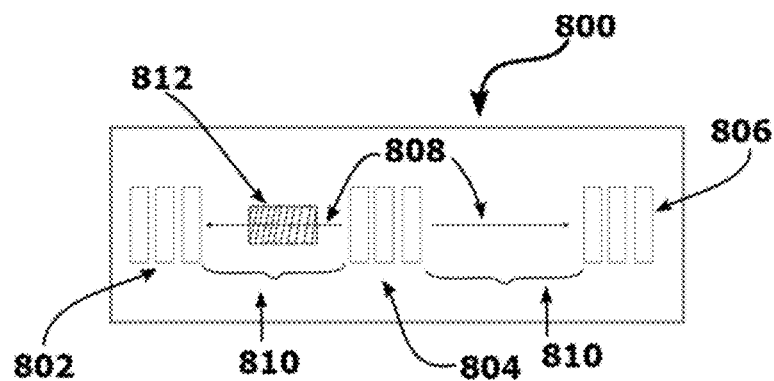
FIG. 4 illustrates a schematic top view of a typical surface acoustic wave unit.

FIG. 4 illustrates a first concept of a method for a differential measurement. In particular, FIG. 4 depicts a top view illustrating a differential measurement performed on a surface acoustic wave unit 800. In simple terms, the unit 800 comprises an acoustic wave generator 804, which may be also be referred to as an acoustic wave sender 804, or simply as sender 804. The sender 804 is configured for generating acoustic waves, and the acoustic waves may have propagation directions as conceptually identified by reference numeral 808.

Further, the unit 800 also comprises two transducers 802 and 806 for receiving acoustic waves. The transducer 802 and 806 may be also be referred to as receivers 802 and 806, and more particularly a first receiver 802 and a second receiver 806. The receivers 802 and 806 are located at different longitudinal positions with respect to the sender 804. More particularly, the receivers 802 and 806 are located on opposite longitudinal sides of the sender 804. The receivers 802 and 806 are equidistantly separated from sender 804 by a gap 810 that constitutes the trajectory that a sound wave 810 has to travel from the sender 804 to the receivers 802 and 806. This gap also may be referred to as an interaction area 810.

The sender 804 emits acoustic waves 808 on both directions towards the receivers 802 and 804. In other words, the sender 804 emits a sound wave 808 towards the direction of a first receiver 802, and also emits an identical sound wave 808 towards the second receiver 806. It will be understood that the sender 804 may emit the identical sound waves 808 simultaneously. In the embodiment depicted in FIG. 4, the emitted acoustic waves 808 travel a distance equivalent to the separation gap 810, before impacting on the receivers 802 and 806, where the signals are collected.

Further, when a substance 812, e.g. a sample, is introduced between the sender 804, and for example, the first receiver 802, the acoustic wave 808 may interact with the sample 812. This interaction may alter the characteristics of the sound wave 808 as well as its traveling time, consequently it hits, for example, a first receiver 802 with a time difference respect to the traveling time required for an identical acoustic wave 808 that was emitted towards the direction, for example, of a second receiver 806. Once both signals 808 are collected in the receivers 802 and 806, the difference between both signals constitute the input data for the differential measurement.

In other words, an acoustic wave 808 emitted by a sender 804 interacts with a sample 812 and the resulting response is collected by a receiver 802. Simultaneously, an identical acoustic wave 808 is emitted towards a second receiver 806, which may also be referred to as a reference receiver 806, however this acoustic wave 808 travels through a distance 810 without interacting with a sample 812. Afterwards, the response collected in a first receiver 802 is compared with the signal collected in a second receiver 806.

In more simple words, the unit 800 uses a sound wave 808 that is emitted back by the sender 804 for the reference measurement, which leads to an optimal use of the generated sound power. In practice, a high-precision electrical phase measurement is possible in the range of 10 MHz and 1 GHz, corresponding to a time resolution in the picosecond range. Thus, it can be assumed that small expected effects can also be measured.

However, in this approach, the receivers 802 and 806 are relatively far apart from each other, which may possess the disadvantage of possible imperfect compensations. This may be avoided by the use of a split receiver approach. Further embodiments of the present invention are directed to such a split receiver approach and will be described below.

Figure 5:
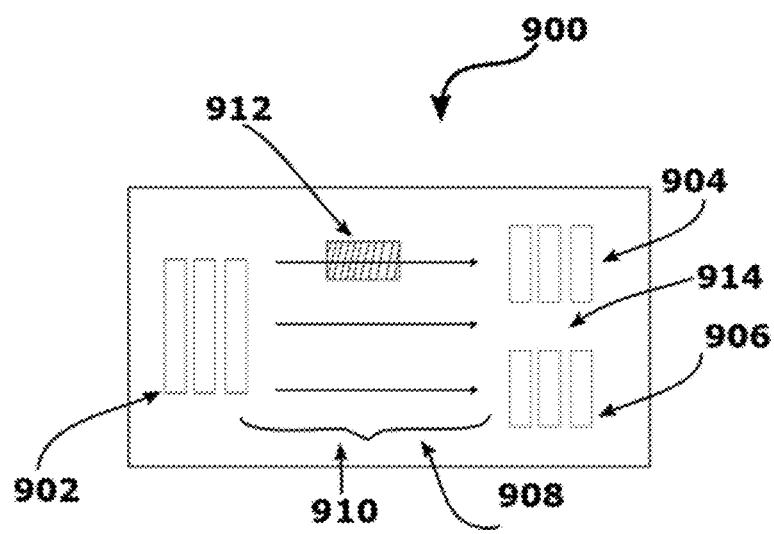
FIG. 5 depicts a schematic top view of surface acoustic wave unit described by the present invention.

FIG. 5 depicts a top view illustrating a differential measurement performed on a surface acoustic wave unit 900 in accordance with an embodiment of the present invention. In simple terms, the unit 900 comprises an acoustic wave generator 902, which may also be referred to as an acoustic wave sender 902, sender transducer 902, or simply as sender 902. The sender 902 is configured for generating acoustic waves, which are conceptually identified by reference numeral 908. I.e., again their propagation direction defining a longitudinal direction is identified by reference numeral 908.

Further, the unit 900 also comprises two transducers 904 and 906 for receiving the acoustic waves 908. The transducers 904 and 906 may be also referred to as receivers 904 and 906, and more particularly a first receiver 904 and a second receiver 906. The receivers 904 and 906 are positioned adjacent to each other, and equidistantly separated from the sender 902 by a gap conceptually identified by reference numeral 910, which may also be referred to as an interaction area 910.

The sender 902 emits acoustic waves 908 that travel across the interaction area 910 and impact on the receivers 904 and 906. Further, the unit 900 is configured to display a separation distance between the receivers 904 and 906, which is conceptually identified by reference numeral 914. This separation 914 allows the introduction of a sample 912 in between the sender 902 and a first receiver 906, without interfering on the trajectory of the sound wave 908 that is traveling toward a second receiver 906.

In other words, when a sample 912 is put in front of the sender 902, it interacts with a portion of the sound wave 908 emitted by sender 902 and the characteristics resulting from this interaction is then collected by a first receiver 904. Meanwhile, the other portion of the sound waves 908 continues its uninterrupted trajectory to a second receiver 906. Afterwards, the response collected in a first 904 is compared with the signal collected in a second receiver 906. In other words, the signal collected in the receiver 906 may be used as a reference to the measurement performed by the receiver 904.

Figure 6:
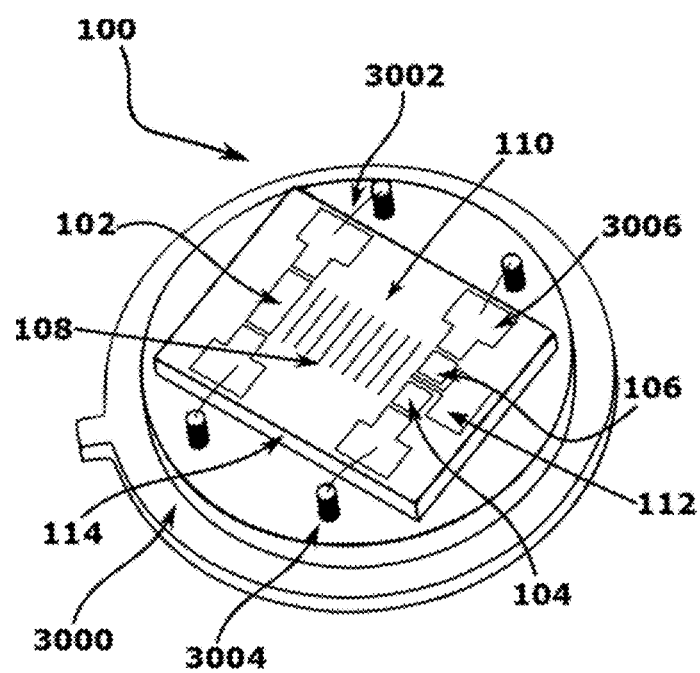
FIG. 6 depicts a surface acoustic wave chip unit according to a general embodiment of the present invention.

FIG. 6 schematically depicts a surface acoustic wave assembly 100, which may also be referred to as a surface acoustic wave chip unit 100 in accordance with an embodiment of the present technology allocated on circular holder 3000. Further details of the functioning principle of embodiments of the surface acoustic wave chip unit 100 are also described in the dissertion at the Technical University Munich by Christoph Strobl, "Mikro- and Nanofluidik auf piezoelektrischen Substraten", Mar. 29, 2005, which is incorporated herein by reference in its entirety, and particularly in chapter 2.3, therein. In particular, the surface acoustic wave chip 100 may comprise (and preferably consist of) a substrate 114, which may be piezoelectric, the substrate may be of, for example: lithium tantalate; a single crystal such as lithium niobate, quartz, gallium phosphate, strontium titanate; a polycrystalline coating such as barium titanate, lead zirconate titanate (PZT); thin films such as zinc oxide. In simple terms, the surface acoustic wave chip unit 100 comprises a transducer 102, which is an acoustic wave generator. The transducer 102 may also be referred to as an acoustic wave sender 102, sender unit 102, or simply as sender 102. The sender 102 is configured for generating acoustic waves having wave fronts conceptually represented by bars and identified by reference numeral 108. The acoustic wave 108 may also be referred to as sound path 108, propagation path 108 or simply as path 108. The surface acoustic wave chip unit 100 is electrically connected to a circular holder 3000 by means of thin wires 3002. Each wire 3002 is also linked to connecting points 3006 positioned near the edge of each corner of the surface acoustic wave chip unit 100. Further, each wire 3002 is connected to a pin 3004, which is allocated on each side of the chip unit 100.

The surface acoustic wave chip unit 100 may further comprise two transducers 104 and 106 functioning as receivers 104 and 106, and more particularly as a first receiver 104 and a second receiver 106. The receivers 104, 106 may form a detection unit. The receivers 104 and 106 are positioned opposite to the sender 102 and separated by distance 110 respect to the sender 102, which may also be referred to as a propagation surface 110 or as interaction portion 110. This propagation surface 110 may also be coated with a conductive layer, for example: a metallic layer such as aluminum, titanium, gold, gallium, arsenide, or a conductive polymer such as pentacene, polyacetylene (PAc) (particularly when doped), polyphenylene vinylene (PPV), polypyrrole (PPy), polythiophenes (PTs), polyaniline (PANI), polyphenylene sulfide (PPS—particularly when doped), poly(3,4-ethylene-dioxythiophene) (PEDOT), and their composites. Further the receivers 104 and 106 are positioned perpendicularly centered to the sender 102 and aligned adjacent to each other and separated by a divider 112.

With two receivers 104 and 106 being available, it is possible to perform a differential measurement. In other words, an effect that impacts both halves of the sound path 108 will also be visible in both receivers 104 and 106, for example, temperature fluctuations. Furthermore, inhomogeneous influences impacting the wave 108 only partly will have an effect only on one of the receivers.

The sender 102 may emit an acoustic wave 108 with a defined and adjustable frequency, for example, in the range of 10 MHz to 20 GHz, preferably from 50 MHz to 1 GHz. The generated signal 108 may propagate along the surface 110 and may interact with a sample. It will be understood that the interaction between the wave 108 and a sample will be mainly at the interface of propagation surface 110. Such interaction alters characteristics (e.g., the frequency, the amplitude, and/or the runtime) of the wave 108, which may be then collected by the receivers 104 and 106.

In one embodiment, the signal resulting from the interaction of the wave 108 with a sample may be collected by a first receiver 104 and a second generated signal 108 may be collected in a second receiver 106.

In another embodiment, the sample interacts with a first signal 108 emitted from the sender 102 and the resulting waves may be collected on a first receiver 104. Subsequently, the same sample may be re-fed to the surface acoustic wave chip unit 100 to interact with a second signal 108 that may be collected in a second receiver 106.

In one embodiment, the flow of the sample may be in the same direction of propagation of the signal generated from the sender 102.

Further, the flow of the sample may be perpendicular to the direction of propagation of the signal generated from the sender 102.

In one embodiment, the flow of the sample may be in a first step in the same direction of propagation of the wave 108 and in second step it may be contrary to the direction of propagation of the wave 108.

Further, a measuring cell may be allocated on the surface acoustic wave chip 100. The measuring cell may serve as sealing cup closing the upper half volume above the surface acoustic wave chip 100. Further, the measuring cell may comprise one or multiple recesses, defining, together with the substrate, channels. The recesses may be milled. Embodiments of such cells are explained below.

Depending on the application, the measuring cell may have different milled channels and the channels may define the flow path of a liquid sample. The flow of the sample may be caused by a HPLC drive.

The flow and the surface wave can interact. Due to the structure of the measuring cell or the chip, the interaction between the surface acoustic waves and the flow may be different, depending on: where in the sound path it has taken place, and on how the directions of sound and flow are positioned with respect to one another.

Figure 7:
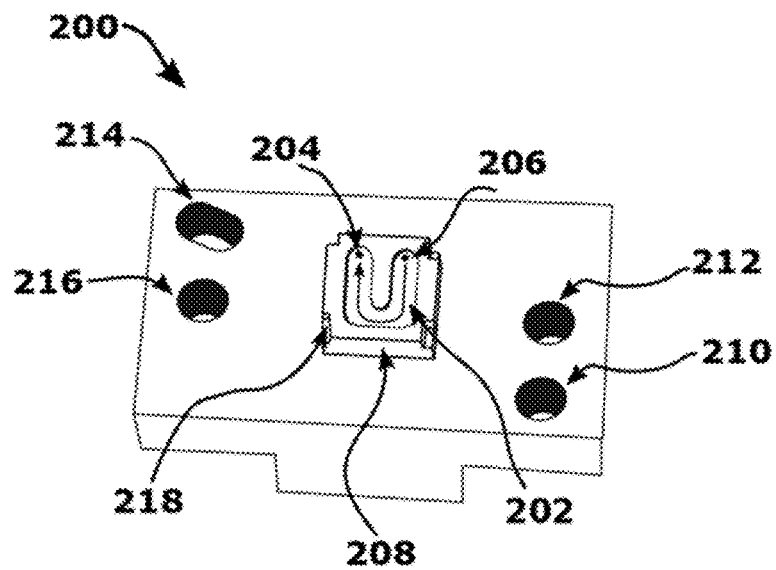
FIG. 7 depicts a measuring cell unit with a milled U-arrangement flow channel according to a general embodiment.

FIG. 7 depicts a measuring cell 200 illustrating an embodiment of the present invention. It will be understood that the measuring cell 200 may be allocated on top of a surface acoustic wave chip 100. It will further be understood that the measuring cell 200 will allow to constrain a fluid within the measuring cell 200. Therefore, it may also be referred to as a sealing cap 200. In simple terms, the measuring cell 200 comprises a recess 202, which, together with the substrate 114, defines a channel with a U arrangement milled onto a protuberance 208 of the measuring cell 200. A cleft 218 is engraved in each corner of the protuberance 208. The cleft 218, which may be also referred to as an indentation 218, permits the measuring cell 200 to fit to the surface acoustic wave chip unit 100 and to ensure the sealing. The measuring cell 200 may be fixed to a high frequency board 1000 by means of bolts screwed through the orifices 210, 212, 214 and 216.

A liquid sample flow may be fed to the channel and subsequently a sample flow may be given to the surface of the acoustic wave chip 100. In other words, when a measuring cell 200 is positioned on top of a surface acoustic wave chip 100, the milled recess 202 and the surface of the surface acoustic wave chip unit 100 define a channel and a liquid sample may be supplied to the channel.

Figure 8:
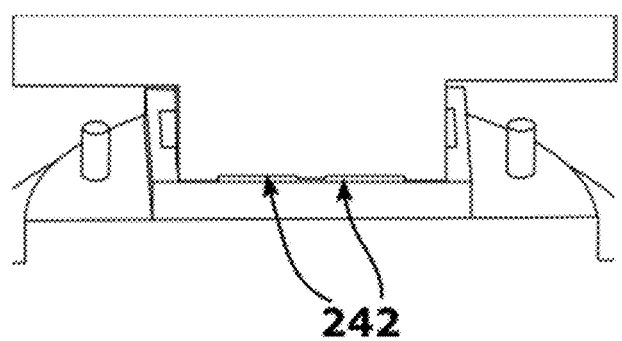
FIG. 8 depicts the channel's height in a cross section of a measuring cell unit depicted in FIG. 7.

The measuring cell 200 may be fluidly connected to a HPLC drive through the orifices 204 and 206. It will be understood that the orifices 204 and 206 may be used indistinctively as entry and exit access to define the direction of the flow. When the measuring cell 200 is positioned on the surface acoustic wave chip 100, a channel with a height 242 as illustrated in FIG. 8. The height 242 is of dimensions, such as, for example, lower than 0.1 mm, that may allow to keep the required sample volume relatively small. Further, the height 242 reduces the liquid layer to a minimum and permit to achieve relative high velocity flows.

Figure 9:
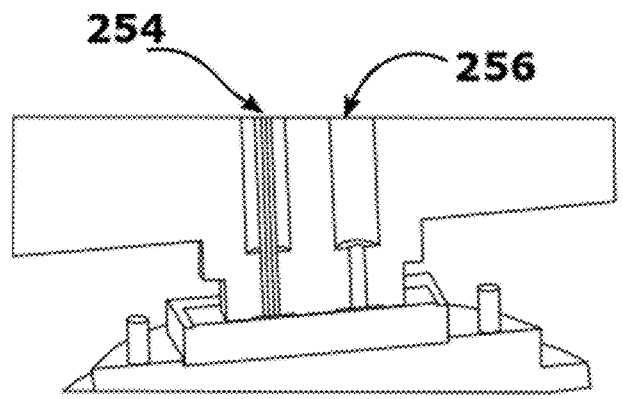
FIG. 9 depicts a cross section of a measuring cell unit depicted in FIG. 7.

FIG. 9 display a cross section of the measuring cell 200, where is possible to observe that the orifices 204 and 206 indeed form access ports to embedded hollow cylindrical paths identified by reference numeral 254 and 256, corresponding to orifices 204 and 206, respectively. These hollow cylindrical paths 254 and 256 may allow to introduce a capillary or capillary pipe to establish fluidic connection of a HPLC system.

Figure 10:
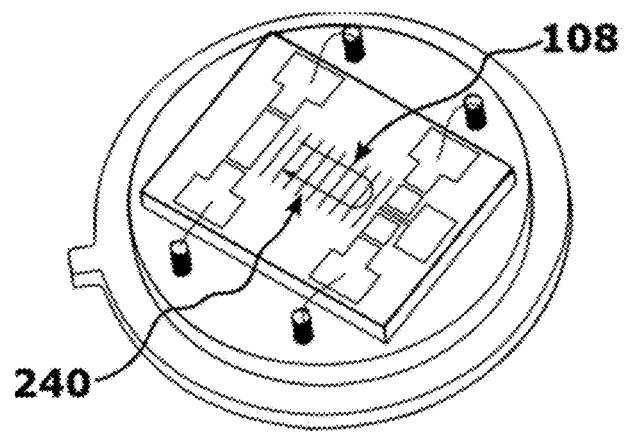
FIG. 10 depicts the sample's flow trajectory on the surface acoustic wave chip as results of the measuring cell unit depicted in FIG. 7.

FIG. 10 depicts the path that a sample follows on the surface acoustic wave chip unit 100 when fed to a measuring cell 200. This path can also be referred to as the trajectory and is conceptually identified by reference numeral 240. The sound wave is identified by reference numeral 108 and propagates from the left to right, as explained before. When a liquid sample is fed to the measuring cell 200, the fluid may flow on top of the surface acoustic wave chip unit 100 on the same propagation direction of the wave 108. The wave resulting of the interaction of a liquid sample with the first half of the sound wave 108 may be collected by a first receiver 104. Subsequently, the sample may flow counter to the sound propagation before exiting the channel 202 and may interact with the second half of the sound wave 108. Thereafter, the resulting signal may be collected by a second receiver 106.

In the measuring cell 200 the fluid may flow in the upper part of the surface acoustic wave chip 100 counter to the propagation direction of the wave 108 and the wave resulting of its interaction may be collected by a receiver 104. Subsequently, the sample may flow in the same direction of the sound wave 108 before exiting the channel 202 and the resulting signal may be collected by a second receiver 106.

Here, the difference in interaction is approximately dependent on the flow velocity and it may take place via the electrical field of the surface acoustic waves 108 or a mechanical influence on the surface acoustic waves 108. Depending on the mechanism, either the intensity or the run time of the surface acoustic waves 108 is primarily influenced. Thus, through the arrangement shown in FIG. 7, the flow-dependent portion in the differential signal is amplified between the two receivers 104 and 106.

Figure 11:
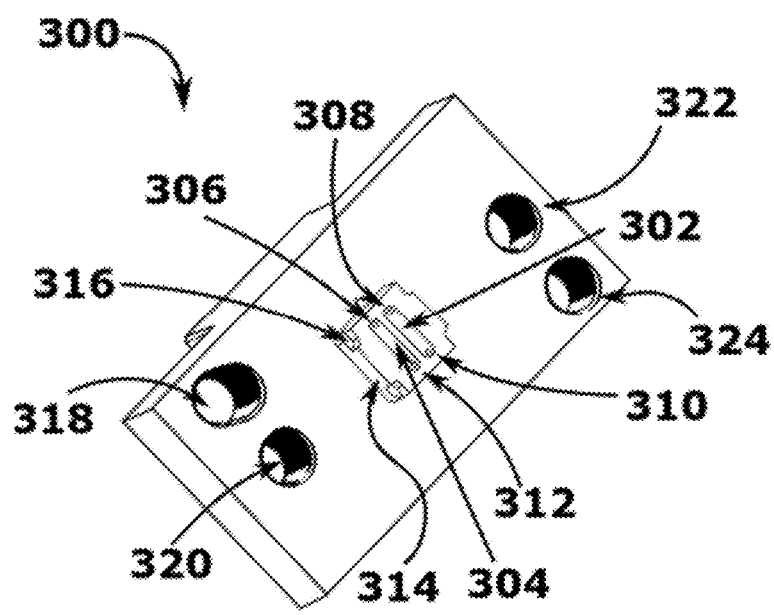
FIG. 11 depicts a measuring cell unit with two milled parallel flow channels according to a general embodiment.
Figure 12:
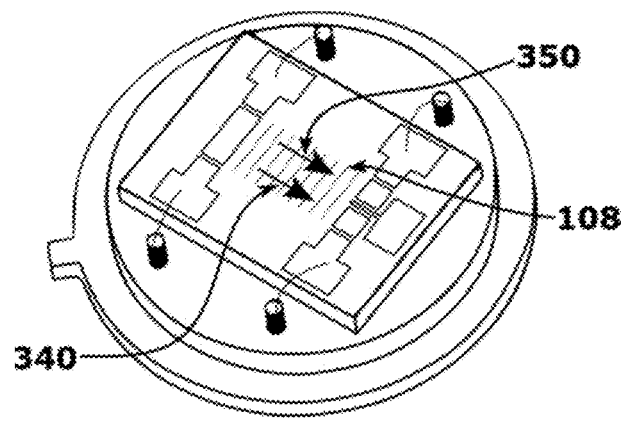
FIG. 12 depicts the sample's flow trajectory on the surface acoustic wave chip as results of the measuring cell unit depicted in FIG. 11.

FIG. 11 depicts a measuring cell 300 that may function as a sealing cap, when it is allocated on the surface acoustic wave chip 100 in accordance to an embodiment of the present invention. The measuring cell 300 may possess two recesses 302 and 304 disposed in parallel. Again, they may, together with the substrate, define channels parallel to each other to guide the liquid sample flow on the surface acoustic wave chip unit 100 following the trajectory identified in FIG. 12 by reference numerals 340 and 350. The recesses 302 and 304 may also be referred to as sound path arrangements 302 and 304, or simply as paths 302 and 304.

Each recess may have two orifices 306, 308, 310 and 312, which may perform as entry and exit orifice, allowing input and output of the sample. It will be understood that the orifices 306, 308, 310 and 312 may be used as entry and exit port indistinctively to define the direction of the flow.

The measuring cell 300 possesses clefts 316 and orifices 318, 320, 322 and 324 with identical purposes as described for the measuring cell 200 in FIG. 7.

In one embodiment, a liquid sample flow may be analyzed by traveling through one channel "302" and subsequently the same liquid sample flow traveling through another channel "304"—while it is noted that the channel is only formed by the combination of the recesses 302, and 304 with the substrate, reference may herein also be made to channels 302 and 304 for ease of description. In other words, a single liquid sample flow may be guided through a first channel, for example, channel 304, for a first examination, and then, after it has passed of a detour line of suitable length, it may be guided to a second channel, for example, channel 304, for a second examination.

In one embodiment, the measurement may be conducted in isocratic methods or with sufficiently slow gradients, which may allow a differential measurement also without a second, completely independent liquid flow if the detour line is slightly longer than the plug of the analyte. In that case, the latter would first appear in one channel, for example 302, and then in second channel, for example 304. Through correlation, the signal of the analyte may be amplified in this manner.

In one embodiment, the parallel channels 302 and 304 may be of identical dimensions.

Further, the parallel channels 302 and 304 may be offset with respect to one another at any desired angle. That is, the described invention comprises sound path arrangements 302 and 304 that are balanced and the slowness and mode purity are taken into account on the direction of propagation. In other words, the path arrangements 302 and 304 in the present invention may vary in angles as long as the angle-dependence of the sound velocity and the anisotropy of the material are equalized and the mode of the generate signal is not affected drastically on the propagation direction of wave 108.

In one embodiment, each orifice 306, 308, 310 and 312 may have individual sample supply, with the same flow direction.

In one embodiment, each orifice 306, 308, 310 and 312 may have individual sample supply with opposite flow direction.

In one embodiment, the sample supply of one orifice 306 may be subsequently the sample supply of a second orifice 310. In other words, the sample may enter an orifice 306 in a defined direction, exiting another orifice 312 located at the other end of the same channel 302, and the sample exiting that orifice 312 then may enter one orifice 310 of the next parallel channel 304.

In one embodiment, two different samples may be supplied to each channel 302 and 304 in the same flow direction of the surface acoustic wave 108.

In one embodiment, two different samples may be supplied to each channel 302 and 304 opposite to the flow direction of the surface acoustic wave 108.

In one embodiment, the two independent parallel channels 302 and 304 may allow to detect an analyte in a very sensitive manner, with the undisturbed fluid flowing through one channel, for example, in channel 302, in one differential measurement, while in the other channel, for example, in channel 304, the fluid is conducted with a plug of an analyte contained therein.

Figure 15:
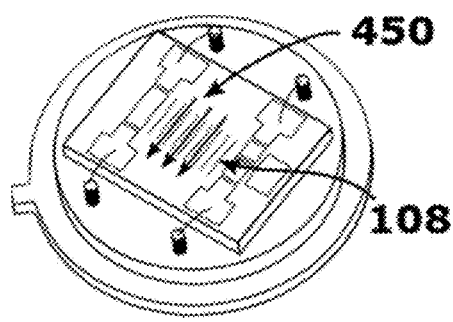
FIG. 15 depicts the sample's flow trajectory on the surface acoustic wave chip as results of a measuring cell unit with a traverse configuration.

In one embodiment, by using further measuring cells, the arrangement proposed in FIG. 11 may be implemented in 90° arrangements. Here, the fluid flows perpendicularly to the sound wave—see FIG. 15 in this regard. At high flow velocities, it has to be expected that the sound wave is slightly taken along by the fluid due to the interaction. In other words, due to interaction with the sample, the surface acoustic waves 108 may be partially dragged or displaced on the same flow direction of the sample.

Figure 13:
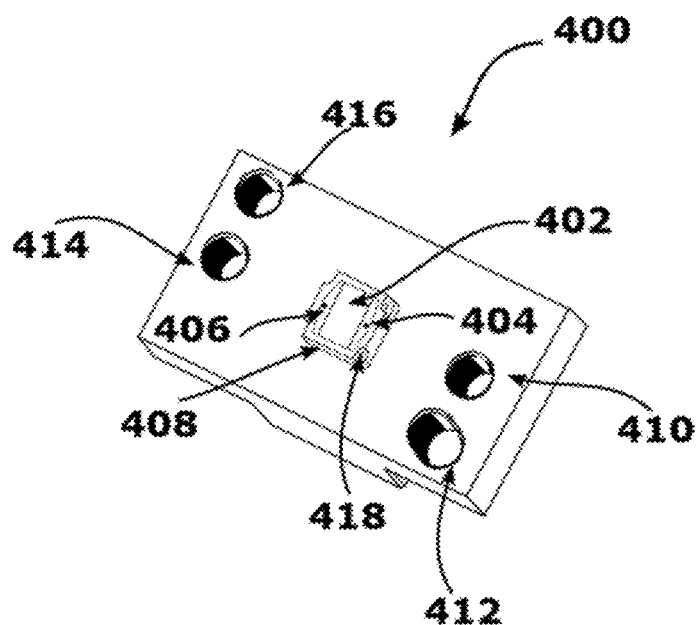
FIG. 13 depicts a measuring cell unit with a milled flow channel according to a general embodiment.
Figure 14:
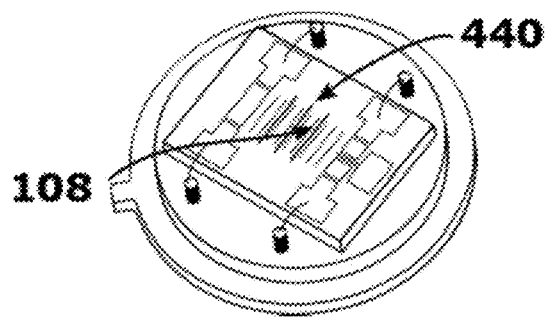
FIG. 14 depicts the surface acoustic wave chip in stationary contact with a liquid sample.

FIG. 13 depicts a measuring cell 400 that may function as a sealing cap, when it is allocated on the surface acoustic wave chip 100. In simple terms, the measuring cell 400 may possess a single recess 402 defining, together with the substrate, a channel to define the flow of the liquid sample. The path followed by the liquid sample may also be referred to as propagation path, propagation trajectory or simply as path, which is conceptually identified by reference numeral 440 in FIGS. 14 and 450 in FIG. 15, for a channel 402 filled with a stationary liquid sample. It will be understood that the arrows in FIG. 15 identified by reference numeral 450 indicates the flow direction of a liquid sample being fed to the measuring cell 400.

The measuring cell 400 may further comprise orifices 404 and 406 positioned opposite to each side of the channel 402 and centered with respect the absolute width of the channel 402. The channel 402 is of such dimensions that once fed, the path 440 is fully covered by the liquid sample, which also permits to hit both receivers 104 and 106 to the same extent and consequently their flow-dependent portion is identical. In a differential measurement, the arrangement of channel 402 facilitates the compensation of effects, such as temperature effects.

The measuring cell 400 possesses clefts 418 and orifices 410, 412, 414 and 416 with identical purposes as described for the measuring cell 200 in FIG. 7.

In one embodiment, the measuring cell 400 may be arranged at 90 degrees with respect the sender 102. In such arrangement, the propagation flow of the liquid sample may be perpendicular to the propagation direction of the waves 108 emitted by the sender 102.

Since the path for fluidics is relatively wide, the channel 402 may be designed in such a way that ensures that the liquid layer is as thin as possible, for example <50 µm. This thickness facilitates a high flow velocity and thus a strong measurement signal.

In other words, the arrangement of the measuring cell 400 is a differential pattern. In more simple words, independently of any damping by the fluid, the velocity of the flow will cause a differential signal in the two receivers 104 and 106. More expediently, the chip will not be designed as shown in FIG. 6, but so as to ensure that the two receivers 104 and 106 are not fully "hit" when the fluidic sample is resting. In other words, when the liquid sample is stationary, the two receivers 104 and 106 may receive different amounts of the wave 108. Temperature effects should also have the same effect in both transducers 104 and 106, and thus be compensated for by means of difference formation.

In all chip-based sensors, the mounting and in particular the alignment from the fluidics to the chip may be of interest. The structures on the chip have to be matched to the fluidic channels. Embodiments of the present invention account for this in different manners.

Figure 16:
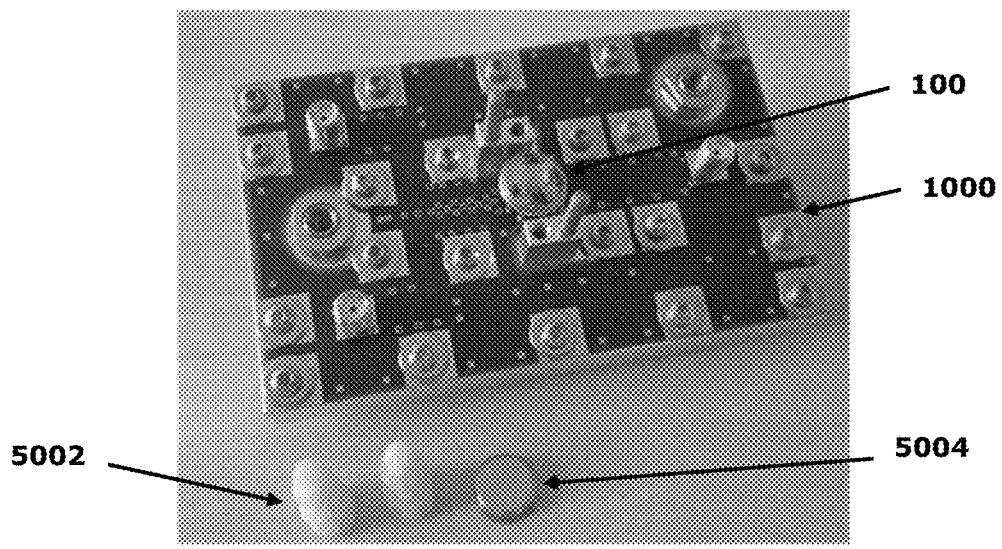
FIG. 16 depicts a measuring cell body with a high frequency circuit board.

The surface acoustic wave chip unit may be allocated on top of a high frequency generator circuit board 1000 as depict on FIG. 16. The board 1000 possesses a series of pins that may permit to fix the surface acoustic wave system. In FIG. 16 a circular battery 5004 and a set of plastic pins are displayed next to the board 1000 as reference of relative size of the surface acoustic wave chip unit 100.

Figure 17:
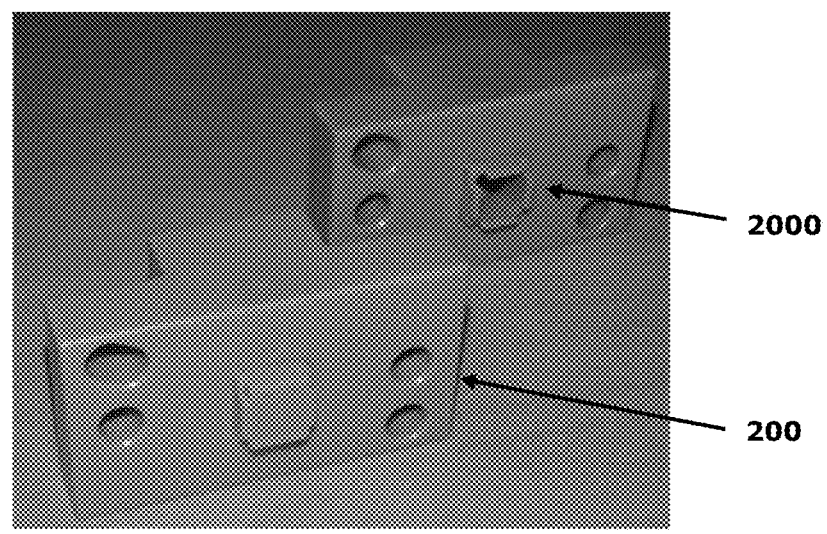
FIG. 17 depicts an adjustment cell according to a general embodiment.

In one embodiment, fine adjustment of the system may be achieved using an adjustment cell 2000 as depict in FIG. 17 next to a measuring cell 200 as comparison. In a first step, the adjustment cell 2000 may be placed loosely on the high frequency circuit body 1000. Then, the adjustment cell 2000 may be displaced in the x- and y-direction (i.e., in the plane of the substrate) together with the mounted surface acoustic wave chip unit 100.

Figure 18:
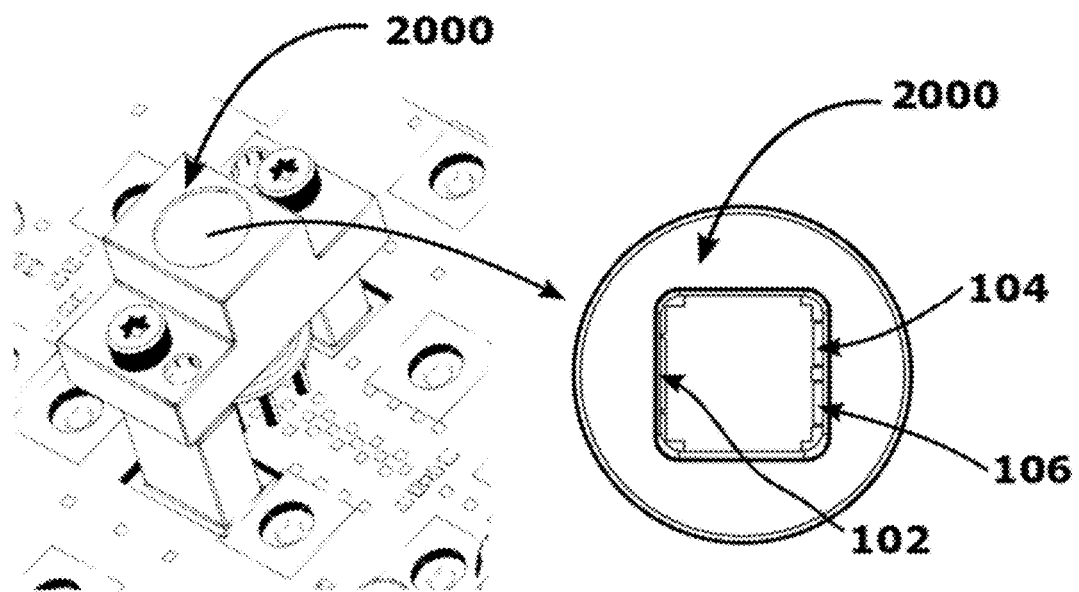
FIG. 18 depicts an adjustment cell mounted on a high frequency board, and a top view where the transducers of the surface acoustic wave chip unit may be observed through the adjusting's slits.
Figure 19:
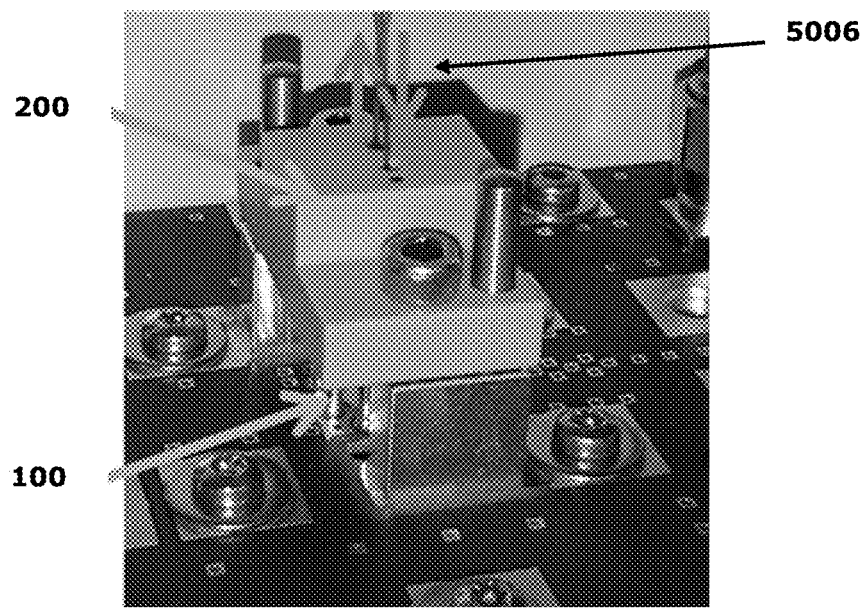
FIG. 19 depicts a measuring cell mounted on a surface acoustic wave chip unit and fluidly connected to a chromatography system.

The adjustment cell 2000 may be displaced with certain freedom sufficiently large to compensate for all conceivable misalignments. Afterwards, the adjustment cell 200 may be fixedly attached to the board 1000 by means of bolts. The circuit board 1000 is displaced together with the surface acoustic wave unit 100 below the adjustment cell 2000 until the structures can be seen in the opening of the adjustment cell 2000. In FIG. 18 the transducers 102, 104 and 106 may be observed on the side slits of the adjustment cell 2000. Once the optimal adjustment is achieved, the circuit board 1000 may be finally fixed, and the adjusting cap 2000 may be removed and a final measuring cell, for example a measuring cell 200, may be placed on the surface acoustic wave chip unit 100, as observed in FIG. 19, and a fluidic connection 5006 may be established.

Subsequently, any of the measuring cells previously described can be arranged, and the structures of the surface acoustic wave chip 100 may come to rest in the right position. This approach permits manufacturing tolerances, such as, for example, just a few 1/100 mm. Further, a final sealing to avoid leakages may be obtained, for example, by means of a thin silicone layer that is coated on the contact surfaces of the selected measuring cell. A further alternative is a sealing by means of a lasered seal made of polytetrafluoroethylene. Subsequently, the fluidic connection may be established by screwing on the capillaries, which may be glued on inside the cap to the unions, which may be embedded in the measuring cell body.

While in the above, a preferred embodiment has been described with reference to the accompanying drawings, the skilled person will understand that this embodiment was provided for illustrative purpose only and should by no means be construed to limit the scope of the present invention, which is defined by the claims.

Whenever a relative term, such as "about", "substantially" or "approximately" is used in this specification, such a term should also be construed to also include the exact term. That is, e.g., "substantially straight" should be construed to also include "(exactly) straight".

Whenever steps were recited in the above or also in the appended claims, it should be noted that the order in which the steps are recited in this text may be accidental. That is, unless otherwise specified or unless clear to the skilled person, the order in which steps are recited may be accidental. That is, when the present document states, e.g., that a method comprises steps (A) and (B), this does not necessarily mean that step (A) precedes step (B), but it is also possible that step (A) is performed (at least partly) simultaneously with step (B) or that step (B) precedes step (A). Furthermore, when a step (X) is said to precede another step (Z), this does not imply that there is no step between steps (X) and (Z). That is, step (X) preceding step (Z) encompasses the situation that step (X) is performed directly before step (Z), but also the situation that (X) is performed before one or more steps (Y1), . . . , followed by step (Z). Corresponding considerations apply when terms like "after" or "before" are used.

The invention claimed is:

1. A system for using an acoustic wave in a chromatography system, wherein the system comprises a surface acoustic wave assembly, wherein the surface acoustic wave assembly comprises
a sender unit comprising a sender transducer for sending an acoustic wave and a detection unit for detecting the acoustic wave,
a substrate configured for propagation of the acoustic wave,
wherein the sender transducer is connected to the substrate,
wherein the substrate comprises a substrate section for propagation of the wave from the sender transducer, wherein this substrate section comprises a substrate surface,
wherein the surface acoustic wave assembly further comprises at least a first channel for conducting solvent with a sample and a second channel for conducting solvent without the sample, wherein the solvent without the sample is used as a reference for a differential measurement, wherein the first and second channels are partly defined by the substrate surface.

2. The system according to claim 1, wherein the system further comprises a measuring cell, and wherein the first and second channels are defined by the substrate surface and by the measuring cell, and wherein the measuring cell is disconnectable from the substrate.

3. The system according to claim 1, wherein the detection unit comprises two receiver transducers.

4. The system according to claim 1, wherein the at least one of the first and second channels comprises a U-channel having a general U-shape in the plane of the substrate surface.

5. The system according to claim 1, wherein at least a part of the substrate is piezoelectric.

6. The system according to claim 1, wherein the channel has a height perpendicular to the substrate surface not exceeding 0.4 mm.

7. A method comprising using an acoustic wave in a chromatography system, wherein the method utilizes the system according to claim 1.

8. The method according to claim 7, wherein the system further comprises a conduit connecting the first channel and the second channel, the method comprising
conducting a solvent through the first channel, through the conduit and through the second channel, and
supplying a sample to the solvent,
wherein when the solvent with the sample is conducted through the first channel, the solvent without the sample is conducted through the second channel, and wherein the method further comprises using the solvent without the sample as a reference for a differential measurement.

\* \* \* \* \*